US011355598B2

(12) United States Patent
Srivastava et al.

(10) Patent No.: US 11,355,598 B2
(45) Date of Patent: Jun. 7, 2022

(54) FIELD MANAGED GROUP III-V FIELD EFFECT DEVICE WITH EPITAXIAL BACK-SIDE FIELD PLATE

(71) Applicant: Analog Devices, Inc., Norwood, MA (US)

(72) Inventors: Puneet Srivastava, Wilmington, MA (US); James G. Fiorenza, Carlisle, MA (US); Daniel Piedra, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/502,285

(22) Filed: Jul. 3, 2019

(65) Prior Publication Data

US 2020/0013862 A1    Jan. 9, 2020

Related U.S. Application Data

(60) Provisional application No. 62/694,717, filed on Jul. 6, 2018.

(51) Int. Cl.
*H01L 29/40* (2006.01)
*H01L 29/778* (2006.01)
*H01L 29/20* (2006.01)

(52) U.S. Cl.
CPC ........ *H01L 29/407* (2013.01); *H01L 29/2003* (2013.01); *H01L 29/7786* (2013.01)

(58) Field of Classification Search
CPC ............... H01L 29/407; H01L 29/2003; H01L 29/7786

(Continued)

(56) References Cited

U.S. PATENT DOCUMENTS 6,265,289 B1    7/2001    Zheleva et al.
6,617,060 B2    9/2003    Weeks, Jr. et al.
(Continued)

FOREIGN PATENT DOCUMENTS

CN    101312207 A    11/2008
CN    102412265 A    4/2012
(Continued)

OTHER PUBLICATIONS

"U.S. Appl. No. 15/975,917, Final Office Action dated Apr. 2, 2020", 17 pgs.
(Continued)

*Primary Examiner* — David Vu
*Assistant Examiner* — Brandon C Fox
(74) *Attorney, Agent, or Firm* — Schwegman Lundberg & Woessner, P.A.

(57) ABSTRACT

A semiconductor device having a back-side field plate includes a buffer layer that includes a first compound semiconductor material, where the buffer layer is epitaxial to a crystalline substrate. The semiconductor device also includes field plate layer that is disposed on a surface of the buffer layer. The semiconductor device further includes a first channel layer disposed over the field plate layer, where the first channel layer includes the first compound semiconductor material. The semiconductor device further includes a region comprising a two-dimensional electron gas, where the two-dimensional electron gas is formed at an interface between the first channel layer and a second channel layer. The semiconductor device additionally includes a back-side field plate that is formed by a region of the field plate layer and is electrically isolated from other regions of the field plate layer.

30 Claims, 16 Drawing Sheets

(58) Field of Classification Search
USPC .......................................................... 257/330
See application file for complete search history.

(56) References Cited

U.S. PATENT DOCUMENTS

| | | | |
|---|---|---|---|
| 7,550,783 | B2 | 6/2009 | Wu et al. |
| 8,283,699 | B2 | 10/2012 | Wu |
| 8,386,377 | B1 | 2/2013 | Xiong et al. |
| 8,441,030 | B2* | 5/2013 | Beach .................. H01L 29/205 257/109 |
| 8,823,012 | B2 | 9/2014 | Lidow et al. |
| 8,853,749 | B2 | 10/2014 | Lidow et al. |
| 9,112,009 | B2 | 8/2015 | Charles et al. |
| 9,432,298 | B1 | 8/2016 | Smith |
| 9,666,677 | B1 | 5/2017 | Raring et al. |
| 10,255,129 | B2 | 4/2019 | Jiang et al. |
| 2009/0146224 | A1 | 6/2009 | Heying et al. |
| 2009/0148985 | A1 | 6/2009 | Heying et al. |
| 2010/0065923 | A1 | 3/2010 | Charles et al. |
| 2011/0106817 | A1 | 5/2011 | Pan et al. |
| 2012/0278263 | A1 | 11/2012 | Borthwick et al. |
| 2013/0153967 | A1* | 6/2013 | Curatola ............ H01L 29/2003 257/194 |
| 2013/0234146 | A1 | 9/2013 | Prechtl |
| 2013/0320400 | A1 | 12/2013 | Hurkx et al. |
| 2014/0298351 | A1 | 10/2014 | Usui |
| 2015/0155358 | A1 | 6/2015 | Briere |
| 2015/0311330 | A1 | 10/2015 | Li et al. |
| 2015/0318388 | A1 | 11/2015 | Schubert et al. |
| 2016/0064538 | A1 | 3/2016 | Nakayama et al. |
| 2016/0071967 | A1* | 3/2016 | Prechtl ................ H01L 29/7787 257/76 |
| 2016/0141405 | A1 | 5/2016 | Werner et al. |
| 2016/0254363 | A1 | 9/2016 | Suh et al. |
| 2016/0380090 | A1 | 12/2016 | Roberts et al. |
| 2017/0270245 | A1 | 9/2017 | Van Rooyen et al. |
| 2017/0294528 | A1 | 10/2017 | Ren et al. |
| 2018/0175186 | A1* | 6/2018 | Chen .................. H01L 29/0688 |
| 2018/0189691 | A1 | 7/2018 | Oehrle et al. |
| 2018/0331186 | A1 | 11/2018 | Srivastava et al. |
| 2020/0219871 | A1* | 7/2020 | Moens .................. H01L 29/404 |

FOREIGN PATENT DOCUMENTS

| | | |
|---|---|---|
| CN | 103165445 A | 6/2013 |
| CN | 103715257 A | 4/2014 |
| CN | 103730360 A | 4/2014 |
| CN | 104201283 A | 12/2014 |
| CN | 104241351 A | 12/2014 |
| CN | 106298904 A | 1/2017 |
| CN | 112368843 A | 2/2021 |
| EP | 1659622 B1 | 10/2016 |
| JP | 2011238701 A | 11/2011 |
| TW | 200830550 A | 7/2008 |
| TW | I397998 B | 6/2013 |
| TW | 201340325 A | 10/2013 |
| TW | I449173 B | 8/2014 |
| TW | I509795 B | 11/2015 |
| WO | WO-2020010253 A1 | 1/2020 |

OTHER PUBLICATIONS

"U.S. Appl. No. 15/975,917, Notice of Non-Compliant Amendment dated Dec. 16, 2019", 4 pgs.
"U.S. Appl. No. 15/975,917, Response filed Feb. 11, 2020 to Notice of Non-Compliant Amendment dated Dec. 16, 2019", 12 pgs.
"U.S. Appl. No. 15/975,917, Response filed Nov. 20, 2019 to Non Final Office Action dated Aug. 20, 2019", 12 pgs.
"International Application Serial No. PCT/US2019/040598, International Search Report dated Oct. 10, 2019", 4 pgs.
"International Application Serial No. PCT/US2019/040598, Written Opinion dated Oct. 10, 2019", 4 pgs.
"U.S. Appl. No. 15/975,917, Examiner Interview Summary dated Aug. 6, 2020", 4 pgs.
"U.S. Appl. No. 15/975,917, Non Final Office Action dated Dec. 22, 2020", 11 pgs.
"U.S. Appl. No. 15/975,917, Response filed Aug. 3, 2020 to Final Office Action dated Apr. 2, 2020", 12 pgs.
"Chinese Application Serial No. 201810456541.3, Office Action dated Dec. 1, 2020", w/o English Translation, 13 pgs.
"German Application Serial No. 102018111332.3, Office Action dated Oct. 27, 2020", w/o English Translation, 9 pgs.
"International Application Serial No. PCT/US2019/040598, International Preliminary Report on Patentability dated Jan. 21, 2021", 6 pgs.
"Taiwanese Application Serial No. 108123749, Office Action dated Sep. 22, 2020", w/o English Translation, 5 pgs.
"Taiwanese Application Serial No. 108123749, Response filed Nov. 30, 2020 to Office Action dated Sep. 22, 2020", w/ English claims, 40 pgs.
"German Application Serial No. 102018111332.3, Response filed Feb. 25, 2021 to Office Action dated Oct. 27, 2020", w/English claims, 18 pgs.
"Chinese Application Serial No. 201810456541.3, Response filed Apr. 16, 2021 to Office Action dated Dec. 1, 2020", w/English claims, 16 pgs.
"U.S. Appl. No. 15/975,917, Response filed May 24, 2021 to Non Final Office Action dated Dec. 22, 2020", 10 pgs.
U.S. Appl. No. 15/975,917, Srivastava, Puneet, et al.
"U.S. Appl. No. 15/975,917, Non-Final Office Action dated Aug. 20, 2019", 20 pgs.
"U.S. Appl. No. 15/975,917, Notice of Non-Compliant Amendment dated May 6, 2019", 3 pgs.
"U.S. Appl. No. 15/975,917, Response filed Feb. 13, 2019 to Restriction Requirement dated Dec. 13, 2018", 8 pgs.
"U.S. Appl. No. 15/975,917, Response filed Jul. 8, 2019 to Notice of Non-Compliant dated May 6, 2019", 8 pgs.
"U.S. Appl. No. 15/975,917, Restriction Requirement dated Dec. 13, 2018", 7 pgs.
"Taiwanese Application Serial No. 107116285, Office Action dated Feb. 14, 2019", w/ English Translation, 8 pgs.
U.S. Appl. No. 15/975,917, filed May 10, 2018, Gallium Nitride Device for High Frequency and High Power Applications.
"U.S. Appl. No. 15/975,917, Final Office Action dated Jul. 21, 2021", 19 pgs.
"Chinese Application Serial No. 201810456541.3, Office Action dated Jun. 24, 2021", w/English Translation, 30 pgs.
"Chinese Application Serial No. 201810456541.3, Response filed Aug. 25, 2021 to Office Action dated Jun. 24, 2021", w/ English Claims, 15 pgs.
"Chinese Application Serial No. 201980045444.8, Voluntary Amendment filed Jun. 9, 2021", w/English claims, 18 pgs.
"U.S. Appl. No. 15/975,917, Response filed Nov. 17, 2021 to Final Office Action dated Jul. 21, 2021", 16 pgs.
"Chinese Application Serial No. 201810456413, Decision of Rejection dated Mar. 3, 2022", w/o English translation, 7 pgs.
"European Application Serial No. 19831547.5, Partial Supplementary European Search Report dated Mar. 10, 2022", 12 pgs.

* cited by examiner

FIELD MANAGED GROUP III-V FIELD EFFECT DEVICE WITH EPITAXIAL BACK-SIDE FIELD PLATE

PRIORITY

This patent application claims priority from provisional U.S. patent application No. 62/694,717, filed Jul. 6, 2018, entitled, "FIELD MANAGED GROUP III-V FIELD EFFECT DEVICE WITH EPITAXIAL BACK-SIDE FIELD PLATE" and naming James Fiorenza et. al. as inventor, the disclosure of which is incorporated herein, in its entirety, by reference.

STATEMENT REGARDING FEDERALLY SPONSORED RESEARCH

This invention was made with U.S. Government support under Agreement No. HR0011-18-3-0014, awarded by Defense Advanced Research Projects Agency. The U.S. Government has certain rights in the invention.

FIELD OF THE DISCLOSURE

This document pertains generally, but not by way of limitation, to semiconductor devices, and more particularly, to techniques for constructing gallium nitride devices with back-side field plates.

BACKGROUND

Electronic devices that are constructed from gallium nitride-based compound semiconductors can operate at higher frequencies and with higher power levels than similar silicon-based devices. The advantages of these gallium nitride-based devices are derived, at least in part, from the higher critical breakdown field of gallium nitride as compared to silicon (e.g., gallium nitride has a critical breakdown field of 3 MV/cm, while Si has a critical breakdown field of 0.3 MV/cm). The performance of these gallium nitride-based devices may be improved by shaping the electric fields generated within these devices, such as by using source field plates to minimize electric field peaks, such as to enable these devices to be safely driven by higher voltages. U.S. Pat. No. 9,112,009 B2 (hereinafter, the '009 patent) to Charles et. al., for example, describes a III-nitride device with a back-gate and field plate for improving transconductance. The III-nitride device includes a field plate deposited in a trench etched in the back of a silicon substrate from which the III-nitride device is grown. The device described in the '009 patent, however, can be difficult and expensive to manufacture. Additionally, the field plate described in the '009 patent is not epitaxial to the III-nitride material, which can limit the performance improvements derived from the field plate.

BRIEF DESCRIPTION OF THE DRAWINGS

FIGS. 4A, 49, 4C, 4D, and 4E illustrate cross sections of layers of a semiconductor device having a back-side field plate formed using an ion implantation process after forming a two-dimensional electron gas, according to various embodiments.

FIGS. 10A, 1.0B, 10C, 10D, 10E, and 10F illustrate cross sections of layers of a semiconductor device having an n-type back-side field plate formed using a trench and regrowth process, according to various embodiments.

Figure 1:
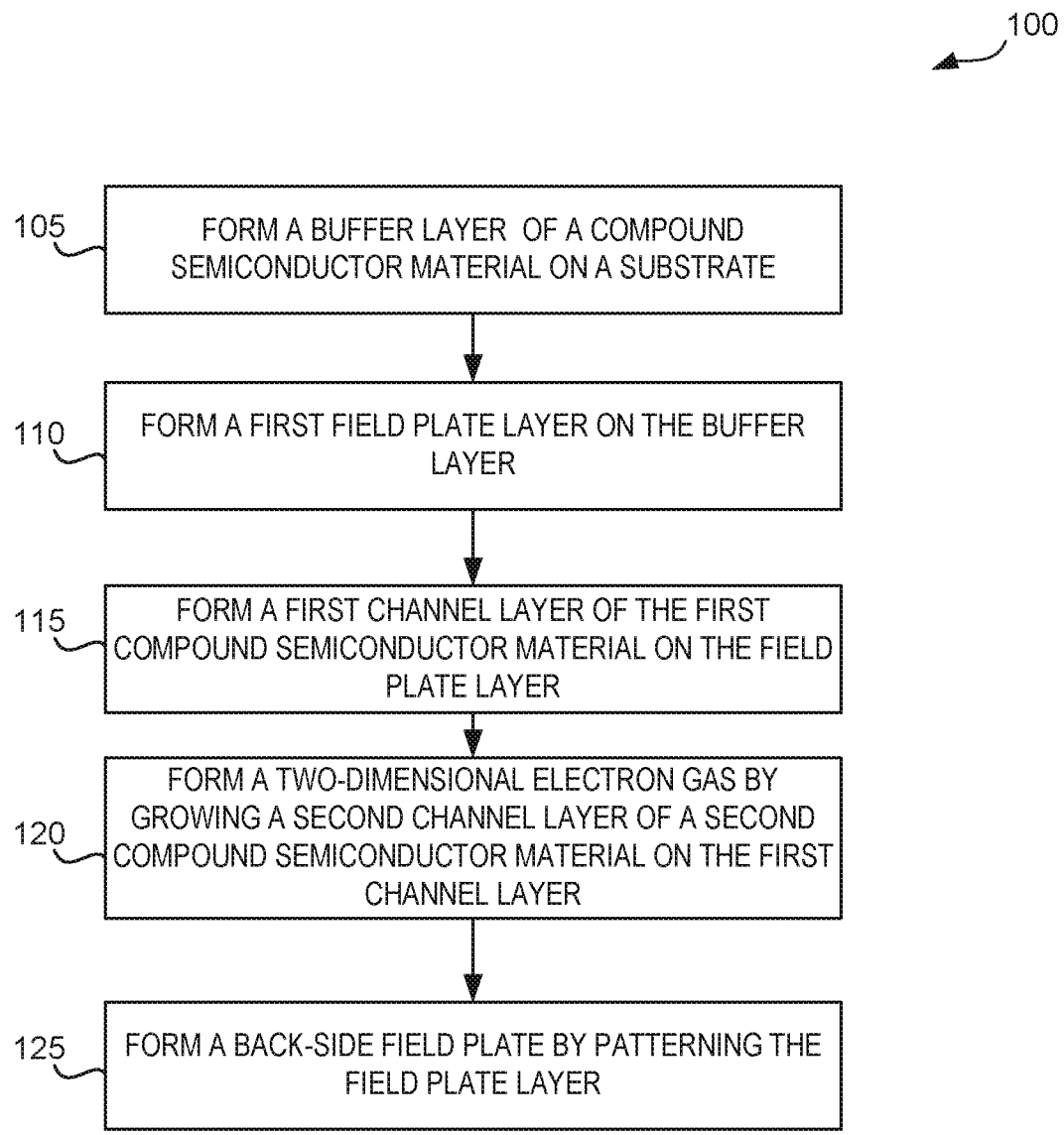
FIG. 1 illustrates a flowchart of an example of a process used to fabricate a semiconductor device, according to various embodiments.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a semiconductor device, such as a high electron mobility transistor, formed from a compound semiconductor, such as a gallium nitride (GaN) compound, and having a back-side field plate that may be epitaxial to the compound semiconductor. The back-side field plate can help deplete channel electrons and can help distribute an electric field in a GaN device, such as to enable operation of the device at higher voltages than other GaN or semiconductor devices, such as to enable the construction of faster or higher power electronic circuits.

Illustrative embodiments include a semiconductor device that may be used at high power densities and at high frequencies, and methods for making such a device. In this context a high-power density may be a power density greater than 5 watts per millimeter (Warm) and a high frequency may be a frequency greater than 5 gigahertz (GHz). A back-side field plate may be epitaxially formed, such as by growing and patterning, on a compound semiconductor during the formation of the semiconductor device, so as to cause the back-side field plate to take on the crystalline structure of the compound semiconductor. The back-side field plate can be used to shape electric fields within the semiconductor device, such as to minimize electric field peaks which can cause charge trapping, device breakdown, and other reliability and performance issues.

A compound semiconductor used to form the semiconductor devices described herein may include a chemical compound of elements from different groups in the periodic table. Such chemical compounds may include a pairing of elements from group 13 (i.e., the group comprising boron (B), aluminum (Al), gallium (Ga), indium (In), and thallium (Tl)) with elements from group 15 (i.e., the group comprising nitrogen (N), phosphorus (P), arsenic (As), antimony (Sb), and bismuth (Bi)). Group 13 of the periodic table may also be referred to as Group III and group 15 as Group V. Without limitation, a semiconductor device may be fabricated from gallium nitride (GaN) and aluminum indium gallium nitride (AlInGaN). Additionally, a semiconductor device may be fabricated using aluminum nitride (AlN)/GaN/AlN hetero-structures, indium aluminum nitride (InAlN)/GaN, GaN/aluminum nitride GaN (AlGaN), or other combinations of group 13 and group 15 elements. These hetero-structures may form a two-dimensional electron gas (2DEG) at the interface of the compound semiconductors that form heterostructure, such as the interface of GaN and AlGaN. The 2DEG may form a conductive channel of electrons that may be controllably depleted, such as by an electric field formed by a gate terminal disposed above the channel, to control a current through the semiconductor device. In an example, the semiconductor device may be a field effect transistor, such as a high electron mobility transistor (HMT), having source and drain terminals electrically coupled to a channel formed by a 2DEG, and a gate terminal disposed above the channel. A voltage on the gate terminal, determined relative to a voltage on the drain terminal, may induce an electric field into the channel to control the concentration of free electrons in the 2DEG, such as to control a flow of current through the transistor.

As used herein, the term epitaxy refers to the formation (e.g., deposition or growth) of a crystalline layer or film on the surface of crystalline substrate, whereby the formed layer takes on the crystal structure and lattice properties of the substrate. Epitaxy may be used in semiconductor device fabrication to form thin-films of single crystals. Epitaxy may be performed in the vapor phase, liquid phase, or solid phase. In some embodiments, molecular beam epitaxy ("MBE") may be used for growing semiconductor crystals from elements in groups 13 and 15, although it should be appreciated that other forms of epitaxy may be used with the techniques described herein.

FIG. 1 illustrates a flowchart of an example of a process 100 for fabricating a semiconductor device, according to various embodiments. The process 100 may be begin by receiving a substrate having a substantially crystalline structure. Such substrate may be received from a prior fabrication process or it may be produced according to one or more substrate growth and processing techniques. Such substrate may be a wafer, such as a wafer of sapphire ($\alpha$-$Al_2O_3$), gallium nitride (GaN), gallium arsenide (GaAs), silicon (Si), silicon carbide (SiC) in any of its polymorphs (including wurtzite), aluminum nitride (AlN), indium phosphide (MP), or similar substrate material used in the manufacture of semiconductor devices. In some embodiments, the substrate may include one or more layers of epitaxially grown material, such as a sacrificial layer for separating one or more layers of a semiconductor device from another layer, or a nucleation or transition layer to help the epitaxial growth of one or more other layers of semiconductor material.

At 105, a buffer layer of a first compound semiconductor material (buffer layer), such as GaN, may be epitaxially grown on the substrate, such as to form a heteroepitaxial thin-film. The quality of a GaN heteroepitaxial thin-film may depend on one or more of the properties of the substrate. Such properties may include a lattice constant, a thermal expansion coefficient, and process-induced properties such as surface roughness, step height, and terrace width; see, e.g., L. Liu et al., "Substrates for gallium nitride epitaxy", Materials Science and Engineering: R: Reports, vol. 37, issue 3, 30 April 2002, pp. 61-127. Thus, these properties should be carefully controlled. Adequate control of these properties may enable the formation of a layer of GaN having extremely high purity or consistency. The buffer layer may be formed by epitaxial growth, or by using another thin-film formation technique, such as chemical vapor deposition (CVD), such as to have a depth of approximately 400-500 nanometers (nm) thick. In some embodiments, however, the buffer layer may include a field plate layer, as described herein. In such embodiments, the buffer layer may be approximately 500-600 nm thick.

At 110, a field plate layer may be formed on the buffer layer. Such field plate layer may include approximately 100 nm of compound semiconductor material that is epitaxially grown over the buffer layer. Such field plate layer may include a portion or region (e.g., a volume as determined by a specified depth) of the buffer layer, such as a 100 nm thick region. Such field plate layer may include a conductive p-type layer, such as a formed by depositing a p-type dopant, such as by using an ion implantation or a CVD technique, into the crystalline structure of the compound semiconductor material in the buffer layer. In an example, a p-type field plate layer may be formed by annealing a semiconductor device having a GaN buffer layer in a chamber with an ambient nitrogen ($N_2$) gas at a thermal annealing temperature that varies between 1000-1100 degrees Celsius (C). Such field plate layer may alternatively include a conductive n-type layer, such as a layer formed by depositing an n-type dopant into the crystalline structure of the compound semiconductor material in the buffer layer, and forming a field plate barrier layer over the doped buffer layer. In an example, a n-type field plate layer may be formed by annealing a semiconductor device having a GaN buffer layer in a chamber with an ambient Silane ($SiH_4$) gas at a thermal annealing temperature that varied between 1000-1100° C., followed by the deposition of an AlN field plate barrier layer. Such doped field plate layers may have a crystalline structure that is substantially similar to, or formed from based on, the crystalline structure of the buffer layer.

In some embodiments, forming the field plate layer may include removing the partially formed semiconductor device from an annealing chamber and performing one or more semiconductor fabrication steps, such as an etch, a planarization, or an ion implantation step.

At 115, a first channel layer (GaN channel layer) of the compound semiconductor material used to form the buffer layer may be formed on the field plate layer. The first channel layer may be formed in the same manner as the buffer layer, such by epitaxial growth, or using another thin-film formation technique. In some embodiments, the first channel layer may be formed by continuing the GaN growth process in the annealing chamber. In other embodiments, such GaN layer may be formed by returning the partially complete semiconductor device to an annealing chamber and initiating a GaN regrow process. Such GaN growth or regrowth process may be continued until a GaN layer of approximately 100 nm is grown.

At 120, a 2DEG may be formed, such as by epitaxially growing a second channel layer (e.g., an AlGaN Channel layer) of a second compound semiconductor material, such as AlGaN, on the surface of the first channel layer, such as to form a heterojunction. The second channel layer may be formed in the same manner as the first channel layer, such by epitaxial growth or using another thin-film formation technique. The first compound semiconductor material and the second compound semiconductor material may be selected to have different bandgaps, such as to form a heterojunction at the interface between the surface of the first compound semiconductor material and the surface of the second compound semiconductor material. Such a selection may enable a two-dimensional electron gas (2DEG) to form at the heterojunction.

At 125, a back-side field plate may be formed by patterning the field plate layer formed at step 110. Such back-side field plate may be formed after step 110 or 120 using one or more of the processes described in the discussion of FIG. 3, 5, 7, 9, 11, or 13. In some embodiments, the back-side field plate may be epitaxial to the buffer layer.

The process 100 may be completed by forming one or more device components and electrically coupling the one or more device elements to the heterojunction. In an example, a source, drain, and a gate of a HEM may formed and coupled electrically coupled to the heterojunction. Back-side field plate contacts may also be formed in the semiconductor device to physically and electrically couple the back-side field plate to ground.

Figure 2A:
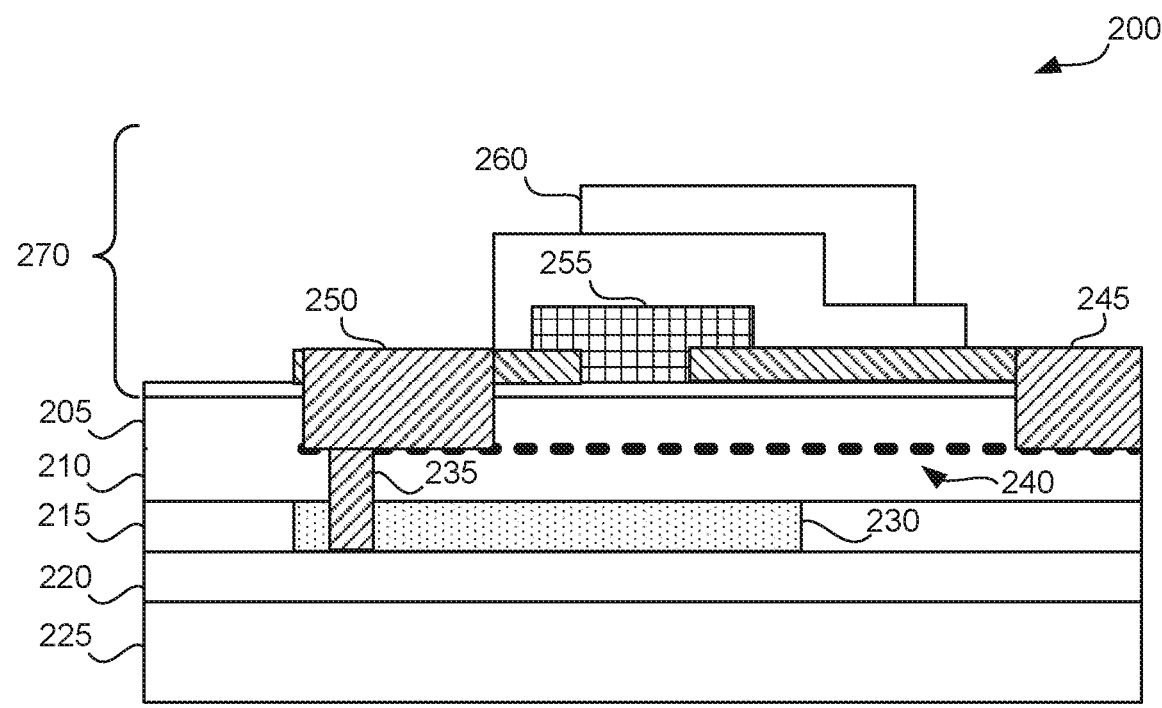
FIG. 2A illustrates a cross section of layers of a semiconductor device that may be fabricated using the techniques described in the present disclosure, according to various embodiments.

FIG. 2A illustrates a cross section of layers of a semiconductor device 200 that may be fabricated in accordance with any of the processes described in the present disclosure, such as the process 100. Such semiconductor device may include a high electron mobility transistor. Such an HEMT may include field-effect transistor ("FET") including at least two semiconducting materials having different band gaps (e.g., a hetero-structure), such as to form a charge carrying channel at the interface between the two semiconducting materials (e.g., a heterojunction). The semiconductor device 200 may include a crystalline substrate 225, a buffer layer 220 (e.g., a first layer of a first compound semiconductor material), a field plate layer 215, first channel layer 210 (e.g., a second layer of the first semiconductor material), a region forming a 2DEG 240, and a second channel layer 205 (e.g., a barrier layer of a second compound semiconductor material). The semiconductor device 200 may also include an epitaxial back-side field plate 230, and one or more devices layers 270. The one or more device layers 270 may include one or more device elements, such as a drain 245, a source 250, a gate 255, a source field plate 260.

In some embodiments, the source 250 may include a source contact (not shown) disposed between the source and the gate 255. The source 250 may also include a back-side field plate contact 235 disposed further from the gate than the source contact. Such disposition of the back-side field plate contact may require that the back-side field plate 230 extend laterally beyond the gate 255 to be aligned with, or under, the source 250, such as to enable the back-side field plate contact to physically and electrically couple the back-side field plate to the source.

Figure 2B:
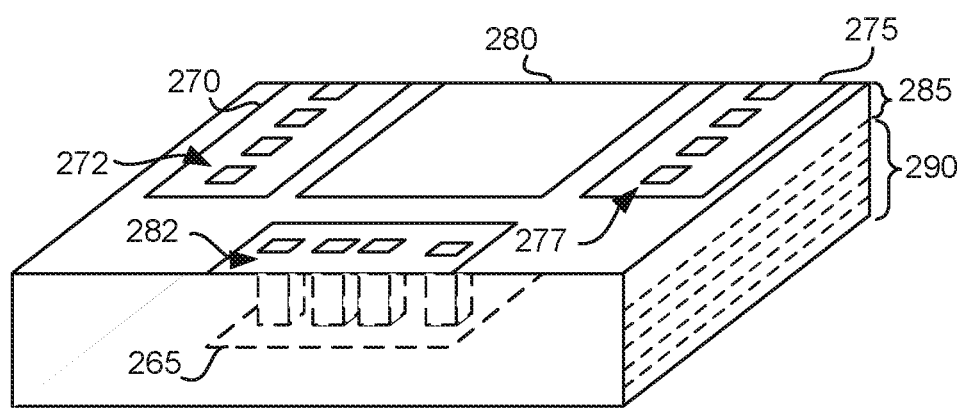
FIG. 2B illustrates a perspective view of an example of a semiconductor device that may be fabricated using the techniques described in the present disclosure, according to various embodiments.

FIG. 2B illustrates a perspective view of an example of a semiconductor device that may be fabricated using the techniques described in the present disclosure, according to various embodiments. The semiconductor device of FIG. 2B includes device layers 290, which may correspond to layers 205, 210, 215, 220, and 225 of the semiconductor device 200. The semiconductor device of FIG. 2B further includes device layers 285, which may correspond to device layers 270, as shown in FIG. 2A. Specific device elements shown in FIG. 2B include an epitaxial back-side field plate 265, a source 270, source contacts 272, a drain 275, drain contacts 277, a gate 280, and backside field plate contacts 282.

FIG. 2B includes an alternate configuration for arranging source contacts 272 and back-side field plate contacts 282. As shown in FIG. 2B, the width of gate 280 enables the back-side field plate contacts to be formed along a back dimension of the gate, while the source contacts are formed along a lateral dimension of the gate. Such configuration may improve the efficiency of a semiconductor device, such as by eliminating the need to extend the back-side field plate 265 under the source 270. Such configuration may also improve performance of the semiconductor device by enabling the back-side field plate 265 to be formed completely under the gate 280.

Figure 3:
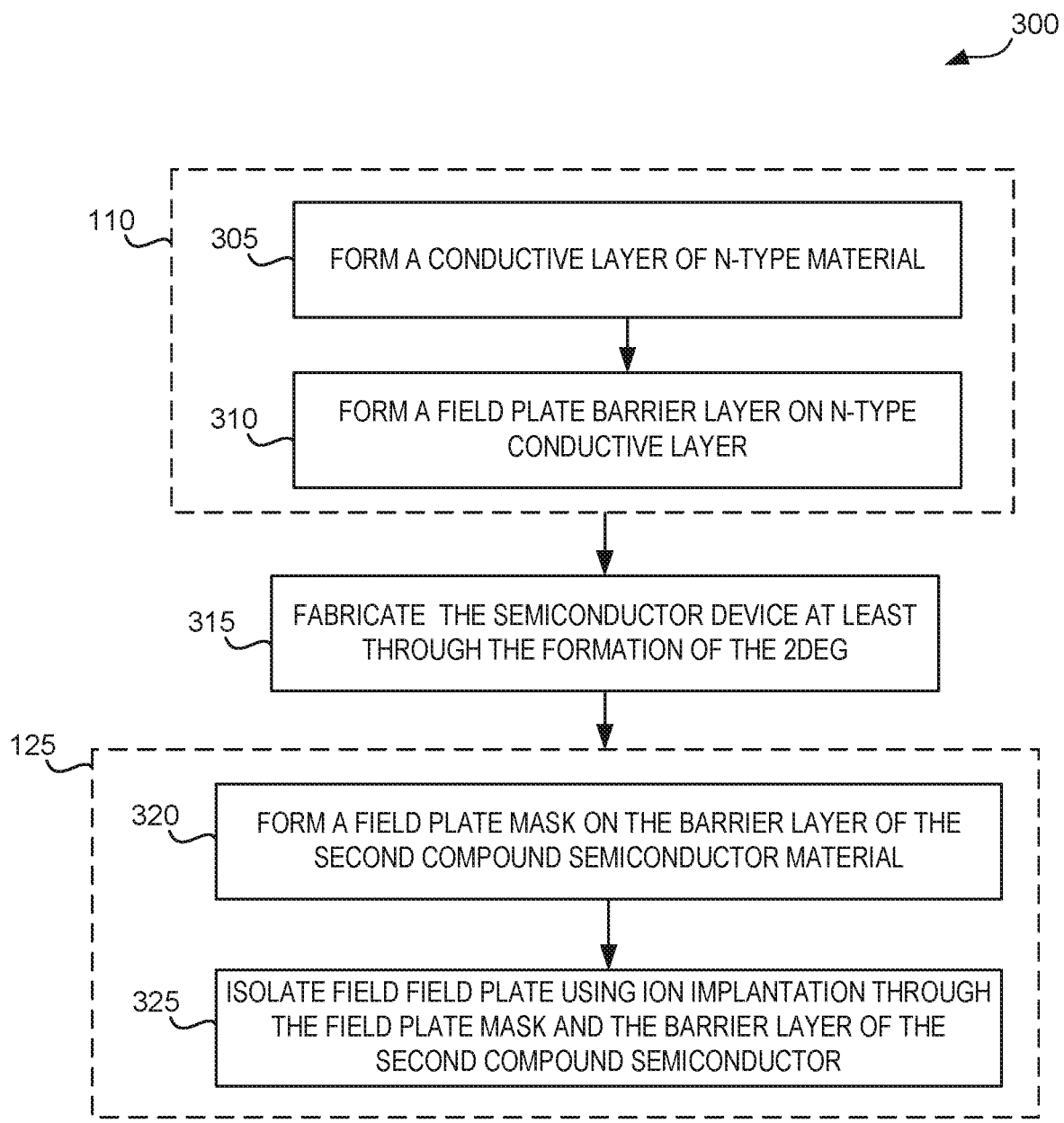
FIG. 3 illustrates a flowchart of an example of an ion implantation process for forming a back-side field plate after forming a two-dimensional electron gas during the fabrication of a semiconductor device, according to various embodiments.
Figure 4A:
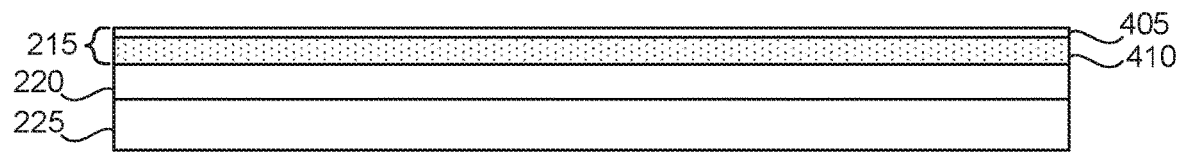

FIG. 3 illustrates a flowchart of an example of an ion implantation process 300 used to form a back-side field plate after forming a 2DEG during the fabrication of a semiconductor device, while FIGS. 4A-4E illustrate cross sections of layer of the semiconductor device at each step in the process 300. The process 300 may be an embodiment of the process 100 with steps 110 and 125 expanded to include specific steps for forming a field plate layer and a back-side field plate, respectively. The process 300 may begin with a partially formed semiconductor device, such as a semiconductor device formed according to step 105 of the process 100 and having a crystalline substrate layer 225 and an epitaxial buffer layer 220, as shown in FIG. 4A.

At 305, a conductive layer of an n-type material 410 may be formed on the buffer layer 220. Such conductive layer may be formed by depositing an n-type dopant material, such as $SiH_4$ using an annealing process, as described herein. At 310, a field plate barrier layer 405 may be deposited on the conductive layer of the n-type material 410. Such field plate barrier layer may include a quantity of material having a thickness of less than 5 nm and selected to inhibit a flow of electrical current between the conductive layer of the n-type material 410 and a subsequently deposed conductive or semi-conductive layer. The field plate barrier layer material may include a p-type material, such as p-type GaN, or an insulator such as AlN.

Figure 4B:
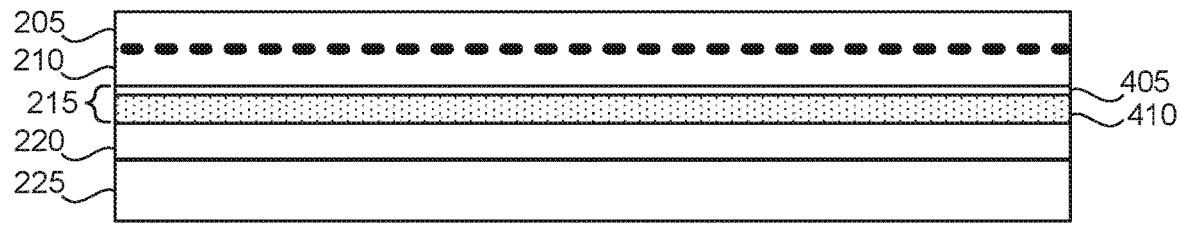

At 315, the semiconductor device can be fabricated at least through the formation of the 2DEG. Such fabrication may include epitaxially forming the first channel layer 210 and forming the 2DEG by epitaxially forming the second channel layer barrier layer 205 as shown in FIG. 4B. In some embodiments, such fabrication may include fabricating one or more device components, such as drain, gate, and source terminals of the semiconductor device.

Figure 4C:
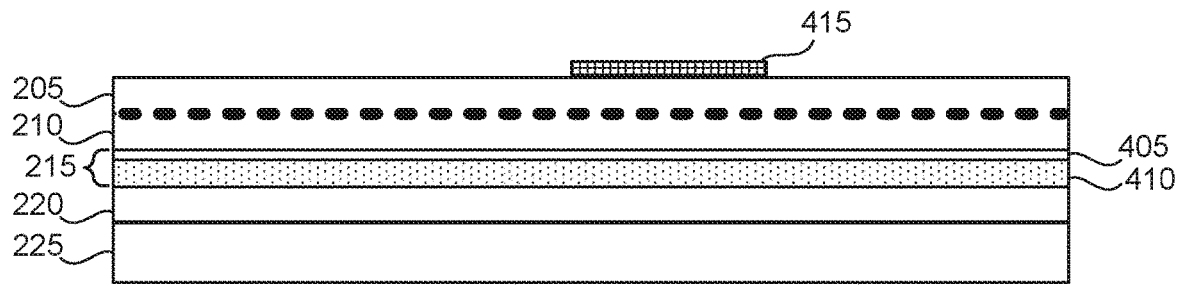

At 320, a field plate mask 415 may be formed, such as to define a geometry and a location of a back-side field plate of the semiconductor device. In some embodiments, such field plate mask 415 may be formed on the second channel layer 205, as shown in FIG. 4C, using a mask material selected to block or impede ions injected to deactivate regions of the n-type conductive layer 410, such as to form a backside field plate of the semiconductor device. Subsequent fabrication steps of a semiconductor device having a field plate that is patterned from a field plate mask formed on the second channel layer 205 may include steps or device layout considerations to ensure that one or more device elements, such as a gate or a drain, are aligned with the position and geometry of the back-side field plate. In some embodiments, the field plate mask 415 may be formed on, or may consists of, one or more device elements of the semiconductor device 200. In these embodiments, a back-side field plate generated in subsequent semiconductor device fabrication steps may be self-aligned to the one or more device elements, thus obviating the need for further alignment considerations.

Figure 4D:
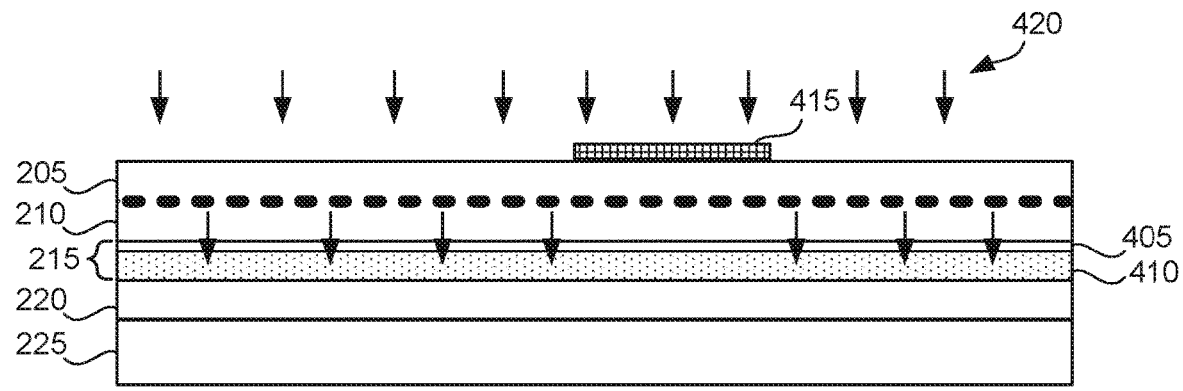
Figure 4E:
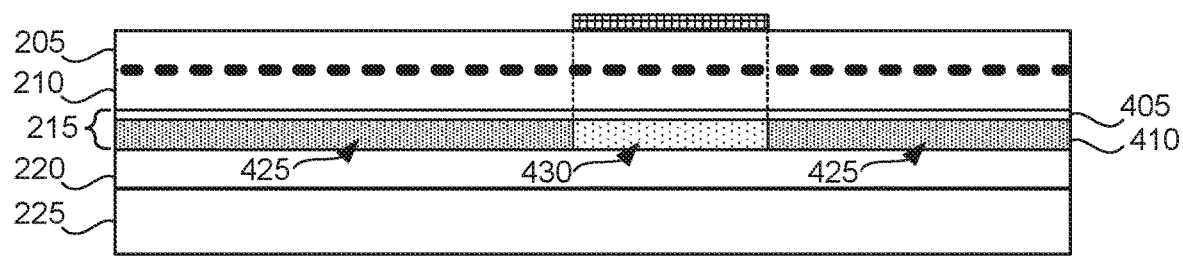

At 325, a back-side field plate can be isolated from the n-type conductive layer 410, such as by using ion implantation to inject a deactivating material, such as nitrogen, into the n-type conductive layer to damage regions that are exposed by the field plate mask 415, as shown in FIG. 4D. The resulting damaged regions 425 and 425 may have increased electrical resistance as compared to the region of the field plate layer under the field plate mask, such as to form an electrically isolated back-side field plate 430 as shown in FIG. 4E. Consideration may be taken to ensure that the injected ions have enough energy to damage the field plate layer 410 while limiting damage to other layers of the semiconductor device, such as to limit damage to the 2DEG to retain electronic transport properties or to reduce defects which may cause charge trapping and drain/body leakage. In some embodiments, such damage and defects may be at least partially healed by annealing the semiconductor device after the ion implantation process. In certain embodiments, the process 300 may be completed by forming one or more device components (e.g., a source electrode, a gate electrode, and drain electrode) and electrically coupling the one or more device components to the 2DEG or the heterojunction forming the 2DEG, as described herein.

Figure 5:
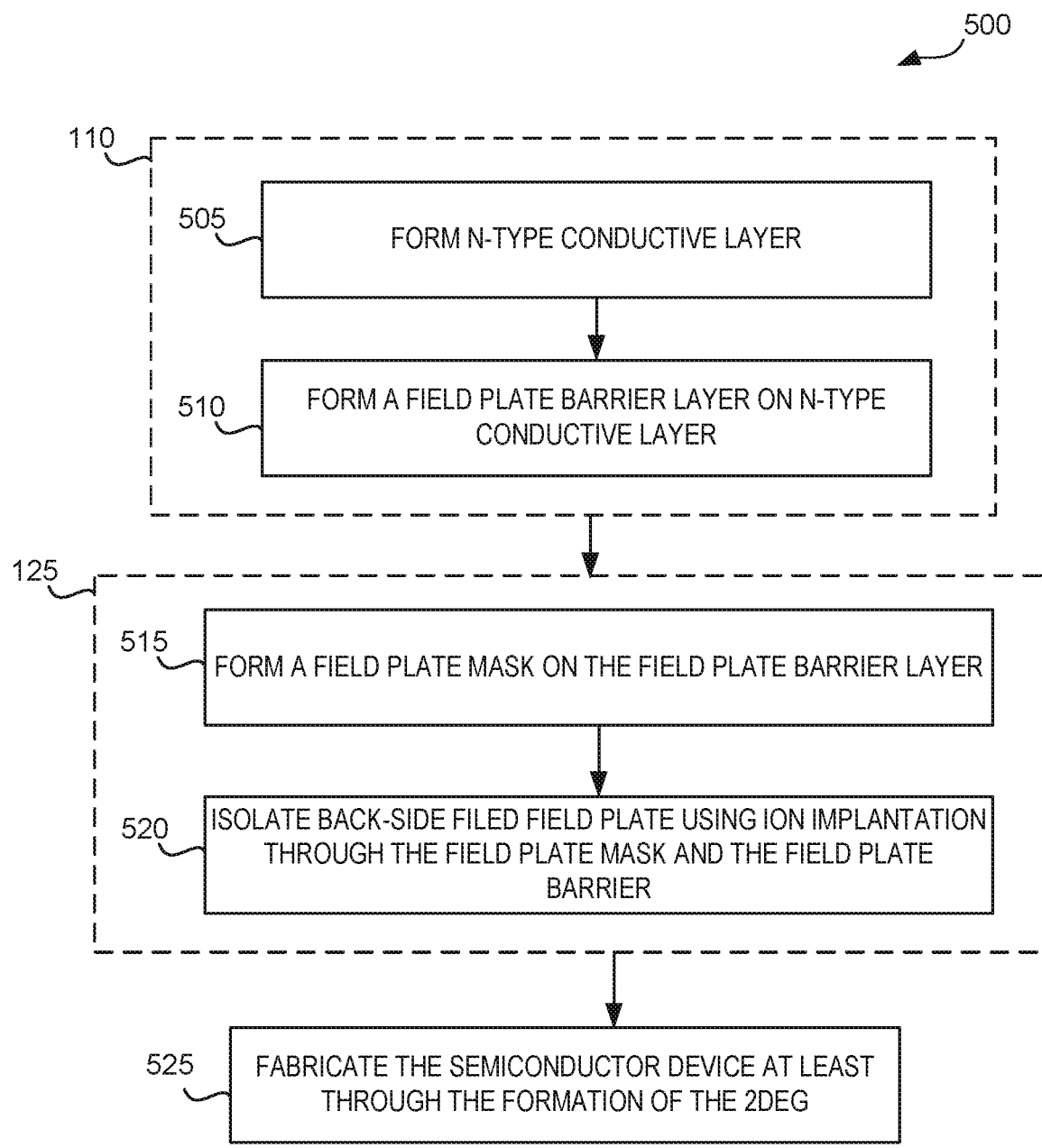
FIG. 5 illustrates a flowchart of an example of an ion implantation process for forming a back-side field plate before forming a two-dimensional electron gas during the fabrication of a semiconductor device, according to various embodiments.
Figure 6A:
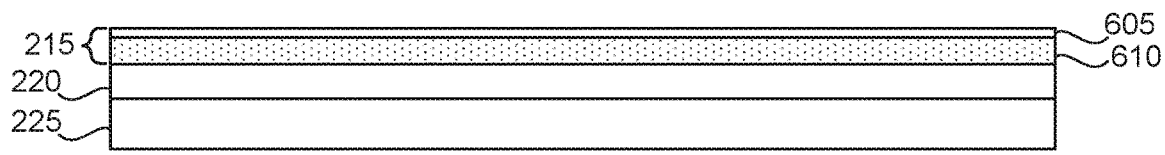
FIGS. 6A, 6B, 6C, 6D, and 6E illustrate cross sections of layers of a semiconductor device having a back-side field plate formed using an ion implantation process before forming a two-dimensional electron gas, according to various embodiments.

FIG. 5 illustrates a flowchart of an example of an ion implantation process 500 used to form a back-side field plate before forming a two-dimensional electron gas during the fabrication of a semiconductor device, while FIGS. 6A-6E illustrate cross sections of layers of the semiconductor device at each step in the process 500. The semiconductor device may be a HEMT device, such as the semiconductor device 200. The process 500 may be an embodiment of the process 100 with steps 110 and 125 expanded to include specific steps for forming a field plate layer, such as the field plate layer 215, and a back-side field plate, such as the back-side field plate 230, respectively. The process 500 may begin with a partially formed semiconductor device, such as a semiconductor device formed according to step 105 of the process 100 and having a crystalline substrate layer 225 and an epitaxial buffer layer 220, as shown in FIG. 6A.

At 505, a conductive layer of n-type material 610 may be formed on the buffer layer 220. Such conductive layer may be formed by depositing an n-type dopant material using an annealing process, as described herein.

At 510, a field plate barrier layer 605 may be deposited on the conductive layer of the n-type material 610, as shown in FIG. 6A. Such field plate barrier layer may be substantially similar to the field plate barrier layer 405, as shown in FIGS. 4A-4E.

Figure 6B:
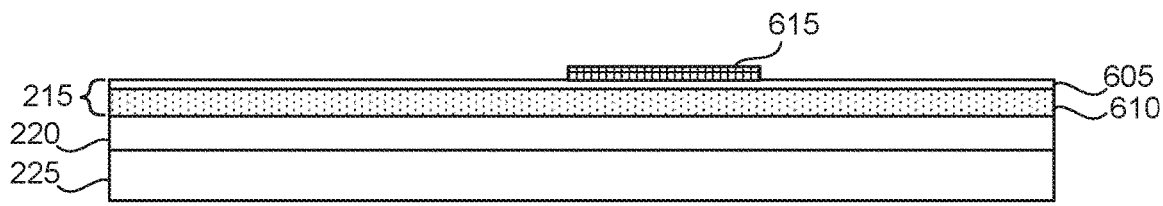

At 515, a field plate mask 615 may be formed, such as to define a geometry and a location of a back-side field plate of the semiconductor device. In some embodiments, such field plate mask 615 may be formed on the field plate barrier layer 605, as shown in FIG. 6B, using a mask material selected to block or impede ions injected to deactivate regions of the n-type conductive layer 610, such as to form, or pattern, a backside field plate of the semiconductor device. Subsequent fabrication steps of the semiconductor device that includes a field plate that is patterned from a field plate mask formed on the field plate barrier layer 605 may include one or more steps or device layout considerations to ensure that one or more device elements, such as a gate or a drain, are aligned with the position and geometry of the back-side field plate.

Figure 6C:
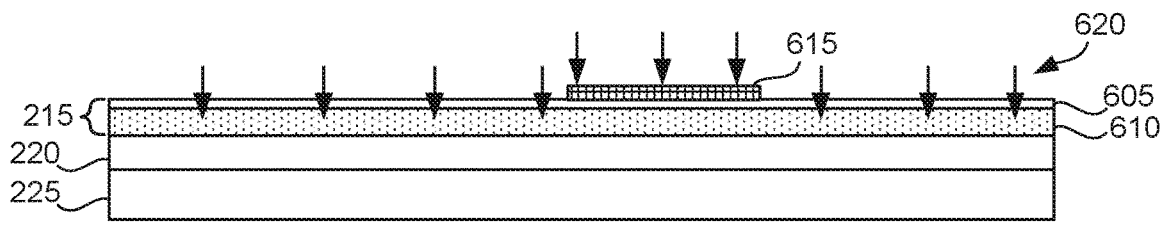
Figure 6D:
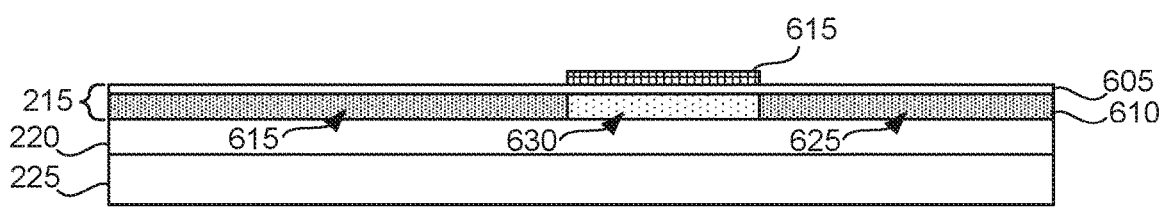

At 520, a back-side field plate can be isolated from the n-type conductive layer 610, such as by using ion implantation of a deactivating material 620, such as nitrogen ions, into the n-type conductive layer to damage regions that are exposed by the field plate mask 615, as shown in FIG. 6C. The resulting damaged regions 615 and 625 may have increased electrical resistance as compared to the region of the field plate layer under the field plate mask, such as to form an electrically isolated back-side field plate 630 as shown in FIG. 6D.

Figure 6E:
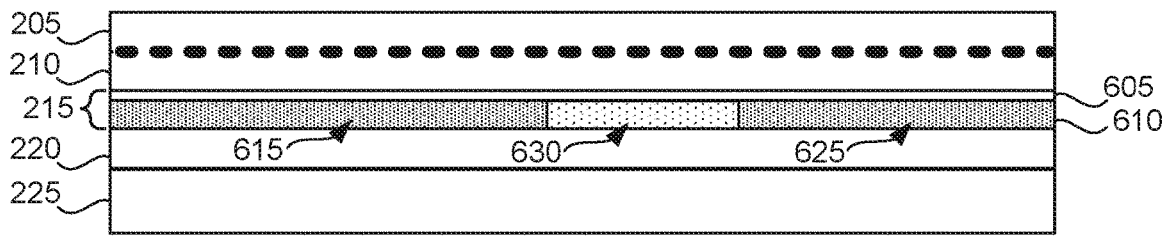

At 525, the semiconductor device can be fabricated at least through the formation of the 2DEG. Such fabrication may include epitaxially growing the second layer of the first semiconductor material 210 and forming the 2DEG by epitaxially growing a barrier layer of a second compound semiconductor material 205 as shown in FIG. 6E. The process 500 may form a back-side field plate using an ion implantation process while limiting the likelihood of causing damage to other layers of the semiconductor device, such as the 2DEG. This may enable higher ion implantation energies to be used, such as to enable the formation of thicker back-side field plates, or back-side field plates that are formed at greater distances from the 2DEG or the gate of the semiconductor device.

In certain embodiments, the process 500 may be completed by forming one or more device components (e.g., a source electrode, a gate electrode, and drain electrode) and electrically coupling the one or more device components to the 2DEG or the heterojunction forming the 2DEG.

In certain embodiments, the process 500 may be combined with the process 200, such as to fabricate a semiconductor device having two or more layers of backside field plates. In an example, a first back-side field plate may be formed according to the process 500 at first depth in the field plate layer 610. A second back-side field plate may then be formed at a second, shallower depth, in the field plate layer using the process 300. Careful selection of each backside field plate depth may enable the two or more back-side field plates to at least partially overlap while remaining electrically isolated.

Figure 7:
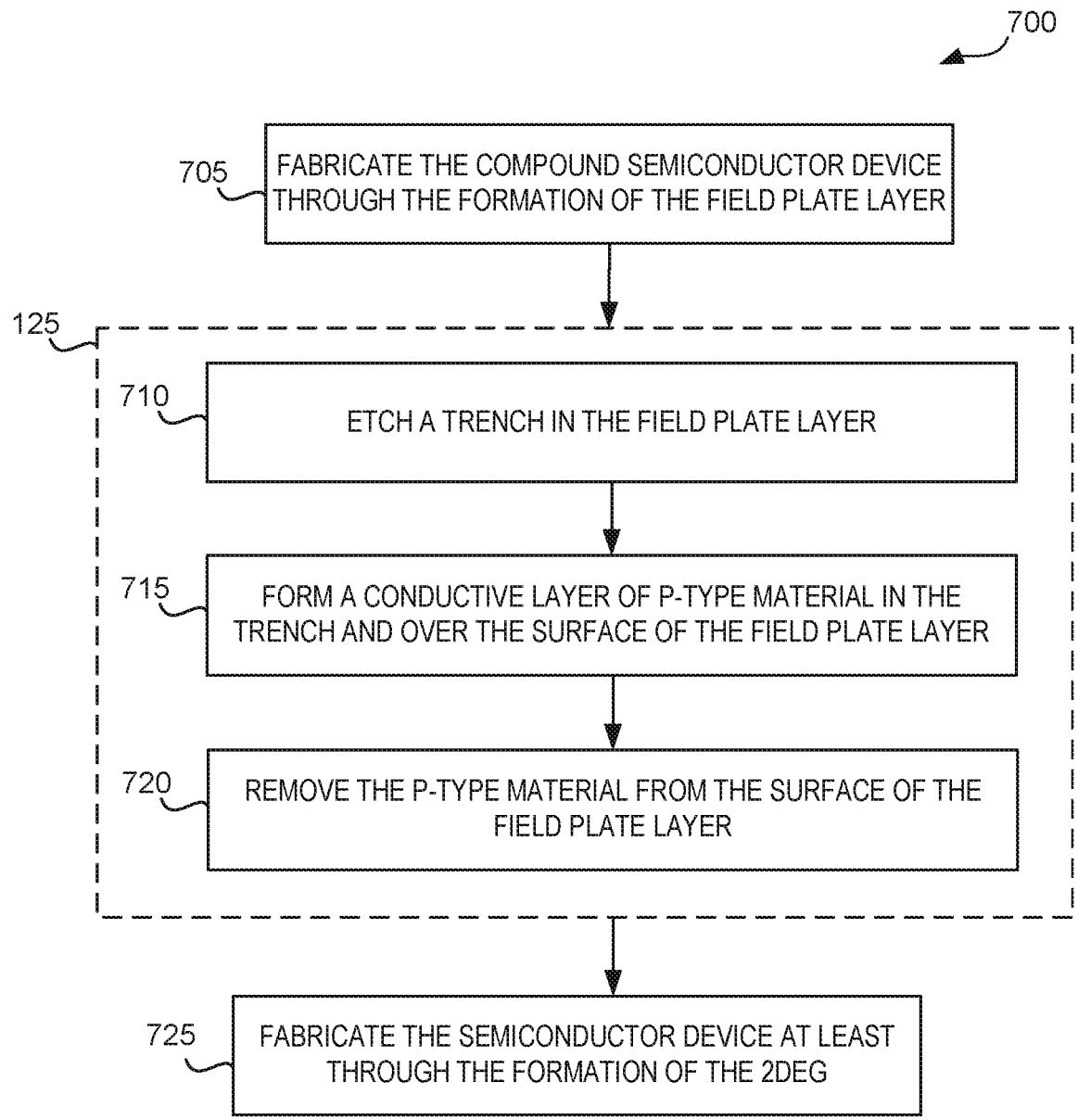
FIG. 7 illustrates a flowchart of an example of a trench and regrowth process for forming a p-type back-side field plate during the fabrication of a semiconductor device, according to various embodiments.

FIG. 7 illustrates a flowchart of an example of a trench and regrowth process used to form a p-type back-side field plate during the fabrication of a semiconductor device, while FIGS. 8A-8E illustrate cross sections of layers of the semiconductor device at each step in the process 700. The semiconductor device may be a HERMIT device, such as the semiconductor device 200. The process 700 may be an embodiment of the process 100 with step 125 expanded to include specific steps for forming a back-side field plate, such as the back-side field plate 230 (FIG. 2).

Figure 8A:
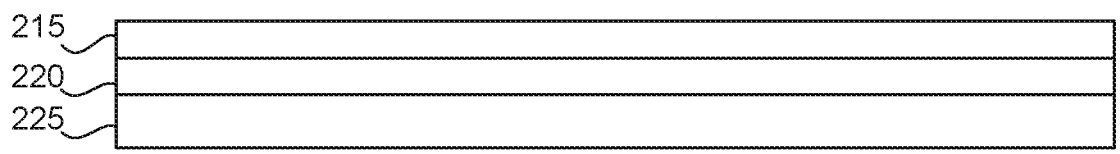
FIGS. 8A, 8B, 8C, 8D, and 8E illustrate cross sections of layers of a semiconductor device having a p-type back-side field plate formed using a trench and regrowth process, according to various embodiments.

At 705, the semiconductor device may be fabricated through the formation of a field plate layer 215 (e.g., an epitaxial field plate layer), as shown in FIG. 8A. Such fabricating may include steps that are substantially similar to steps 105 and 110 of the process 100, such as to form a partially developed semiconductor device having a crystalline substrate layer 225, an epitaxial buffer layer 220, and a field plate layer 215. In some embodiments, the field plate layer 215 (e.g., an insulator layer) may be a part of the buffer layer 220, such as a 100 nm thick region of the buffer layer.

Figure 8B:
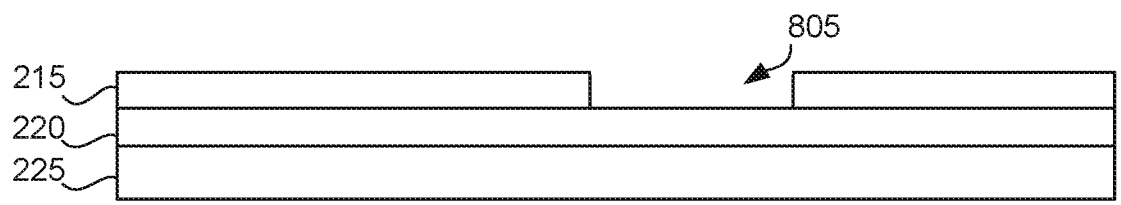

At 710, a trench 805 may be etched in the field plate layer 215, such as by using a dry GaN etching technique such as an inductively coupled plasma or a reactive ion etching process, as shown in FIG. 8B. The trench 805 may be etched to a depth of approximately 100 nm or to another predetermined depth corresponding to desired height of the back-side field pate or a desired distance to locate the back-side field plate away from a device element of a semiconductor device.

Figure 8C:
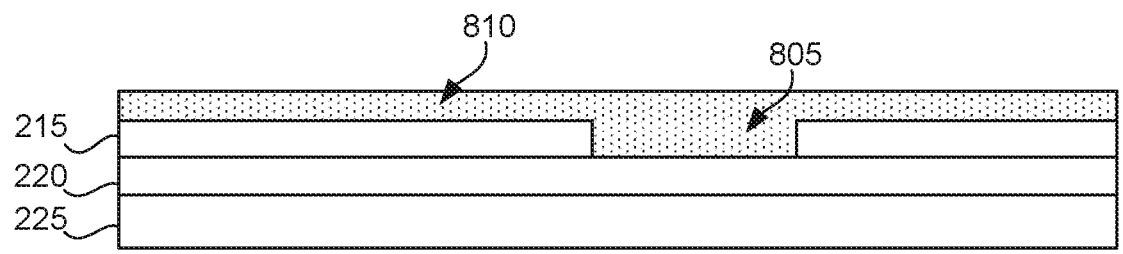

At 715, a conductive layer of p-type material may be formed in the trench 805 and over the top surface of the field plate layer 215. Such conductive layer of p-type material may be grown epitaxially to the field plate layer 215, such as by growing a compound semiconductor, such as GaN, in the trench 805 and over the field plate layer 215, followed by depositing a p-type dopant, such as a magnesium (Mg), using an annealing process. FIG. 8C shows the partially complete semiconductor device with having the conductive layer of p-type material 810 as it is epitaxially formed in the trench 805 and over the top surface of the field plate layer 215.

Figure 8D:
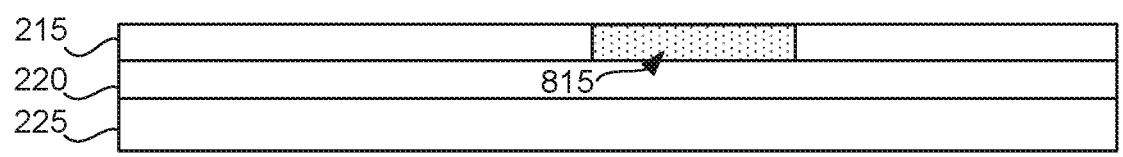

At 720, the p-type material 810 may be removed, such as by using a GaN dry etch process, from the top surface of the field plate layer 215, such as to form an isolated p-type field plate 815 in the trench 805, as shown in FIG. 8D.

Figure 8E:
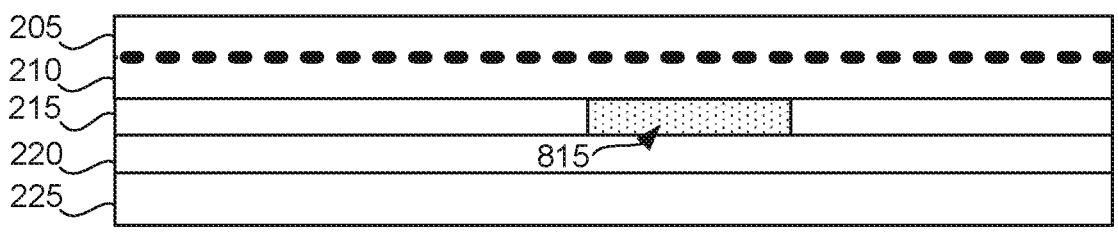

At 725, the fabrication of the semiconductor device can be continued at least through the formation of the 2DEG, as described herein and shown in FIG. 8E.

Figure 9:
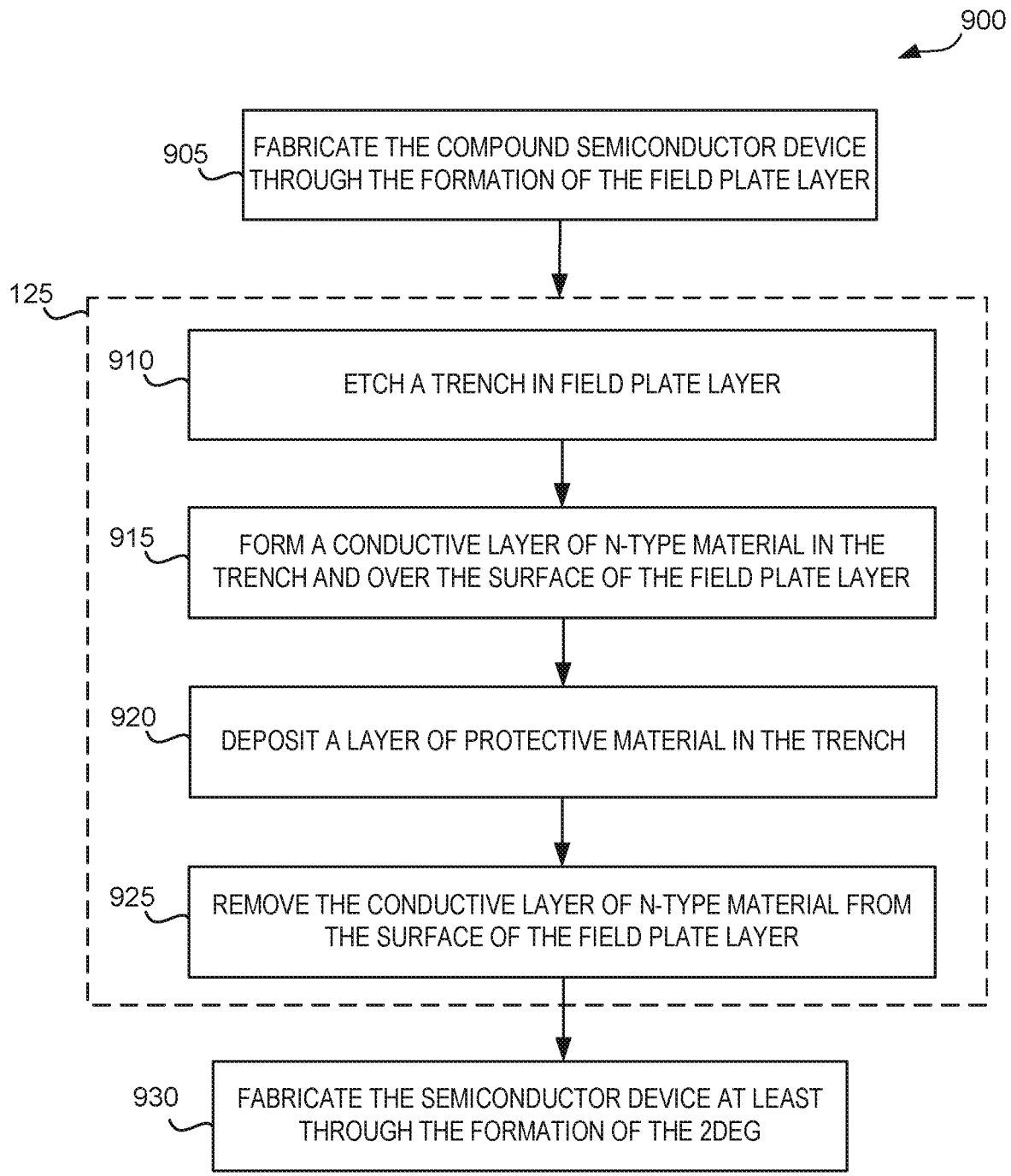
FIG. 9 illustrates a flowchart of an example of a trench and regrowth process for forming an n-type back-side field plate during the fabrication of a semiconductor device, according to various embodiments.
Figure 10A:
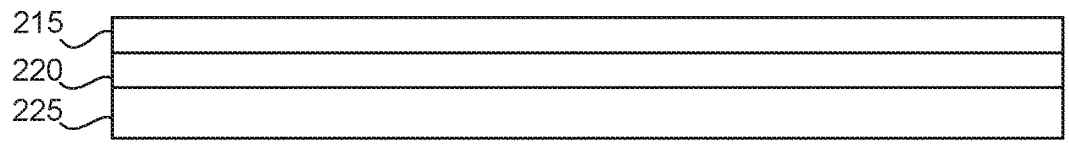

FIG. 9 illustrates a flowchart of an example of a trench and regrowth process 900 used to form an n-type back-side field plate during the fabrication of a semiconductor device, while FIGS. 10A-1.0E illustrate cross sections of layers of the semiconductor device at each step in the process 900. The semiconductor device may be a HEMT device, such as the semiconductor device 200. The process 900 may be an embodiment of the process 100 with step 125 expanded to include specific steps for forming a back-side field plate, such as the back-side field plate 230 (FIG. 2).

At 905, the semiconductor device may be developed through the formation of a field plate layer 215, as shown in FIG. 10A. Such processing may include steps that are substantially similar to steps 105 and 110 of the process 100, such as to form a partially developed semiconductor device having a crystalline substrate layer 225, an epitaxial buffer layer 220, and a field plate layer 215. In some embodiments, the field plate layer 215 may be a part of the buffer layer 220, such as a 100 nm thick region of the buffer layer.

Figure 10B:
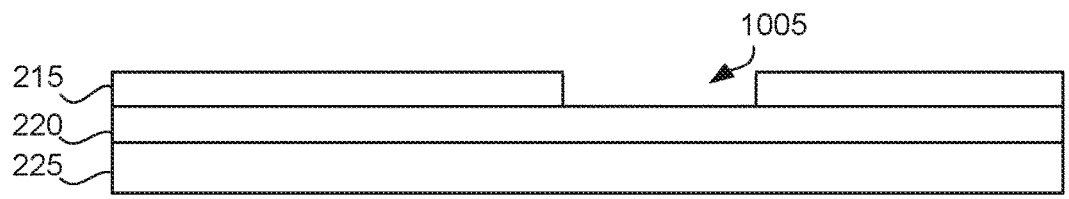

At 910, a trench 1005 may be etched in the field plate layer 215, such as by using a dry GaN etching technique, as shown in FIG. 10B. Such cavity may be etched to a depth of approximately 100 nm or to another predetermined depth corresponding to a desired height of the back-side field plate or a desired distance from the device element, such as a gate, of the semiconductor device.

Figure 10C:
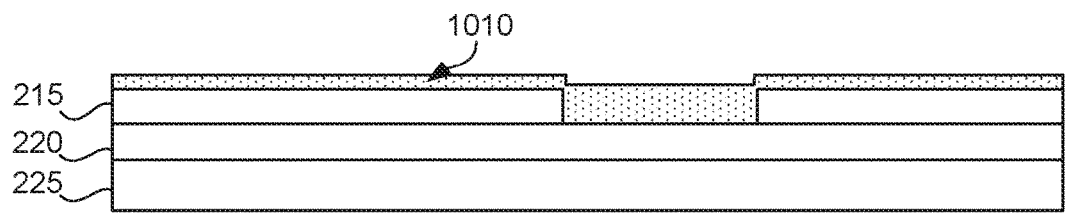

At 915, a conductive layer of n-type material may be formed in the trench 1005 and over the top surface of the field plate layer 215. Such conductive layer of the n-type material may be grown epitaxially to the field plate layer 215, such as by growing a compound semiconductor, such as GaN, in the trench 1005 and over the field plate layer 215, followed by depositing an n-type dopant, such as a $SiH_4$ gas, using an annealing process. FIG. 10C shows the partially complete semiconductor device with having the conductive layer of an n-type material 1010 as it is epitaxially formed in the trench 1005 and over the top surface of the field plate layer 215.

Figure 10D:
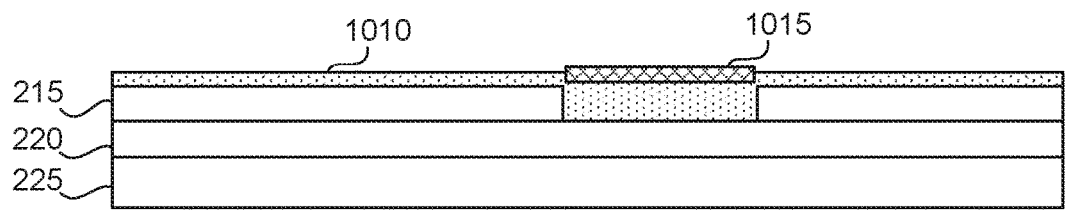

At 920, a layer of a protective material 1015 may be deposited in, or above, the trench 1005, such as to form a mask over the trench to prevent the n-type material formed in the trench from being etched during subsequent processing of the semiconductor device, as shown in FIG. 10D. Such protective material may include silicon nitride or any other material that may serve as mask for this purpose.

Figure 10E:
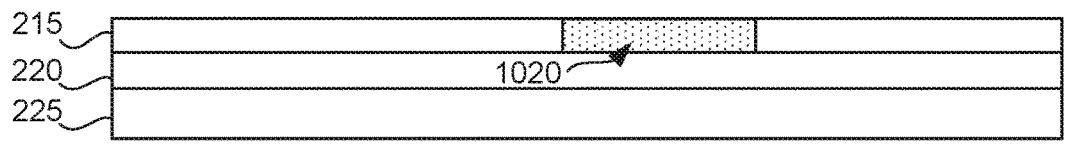

At 925, the n-type material 1010 may be removed, such as by using an etching process, from the top surface of the field plate layer 215, such as to form an isolated n-type field plate 1020 in the trench 1005, as shown in FIG. 10E.

Figure 10F:
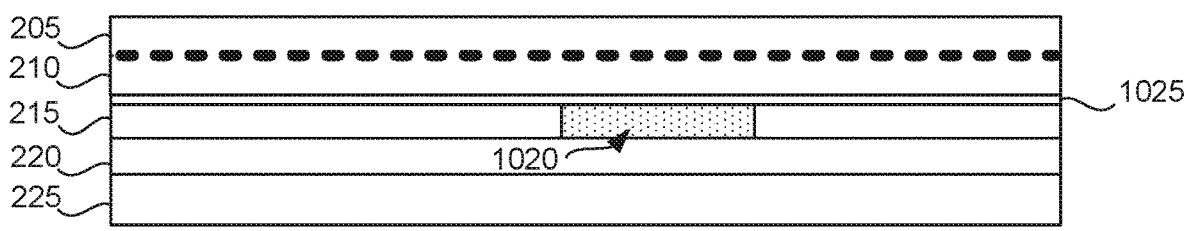

At 930, a field plate barrier layer 1025 may be formed over the field plate layer 215 and over the n-type field plate 1020, and fabrication of the semiconductor device may be continued at least through the formation of the 2DEG, as described herein and shown in FIG. 10F.

Figure 11:
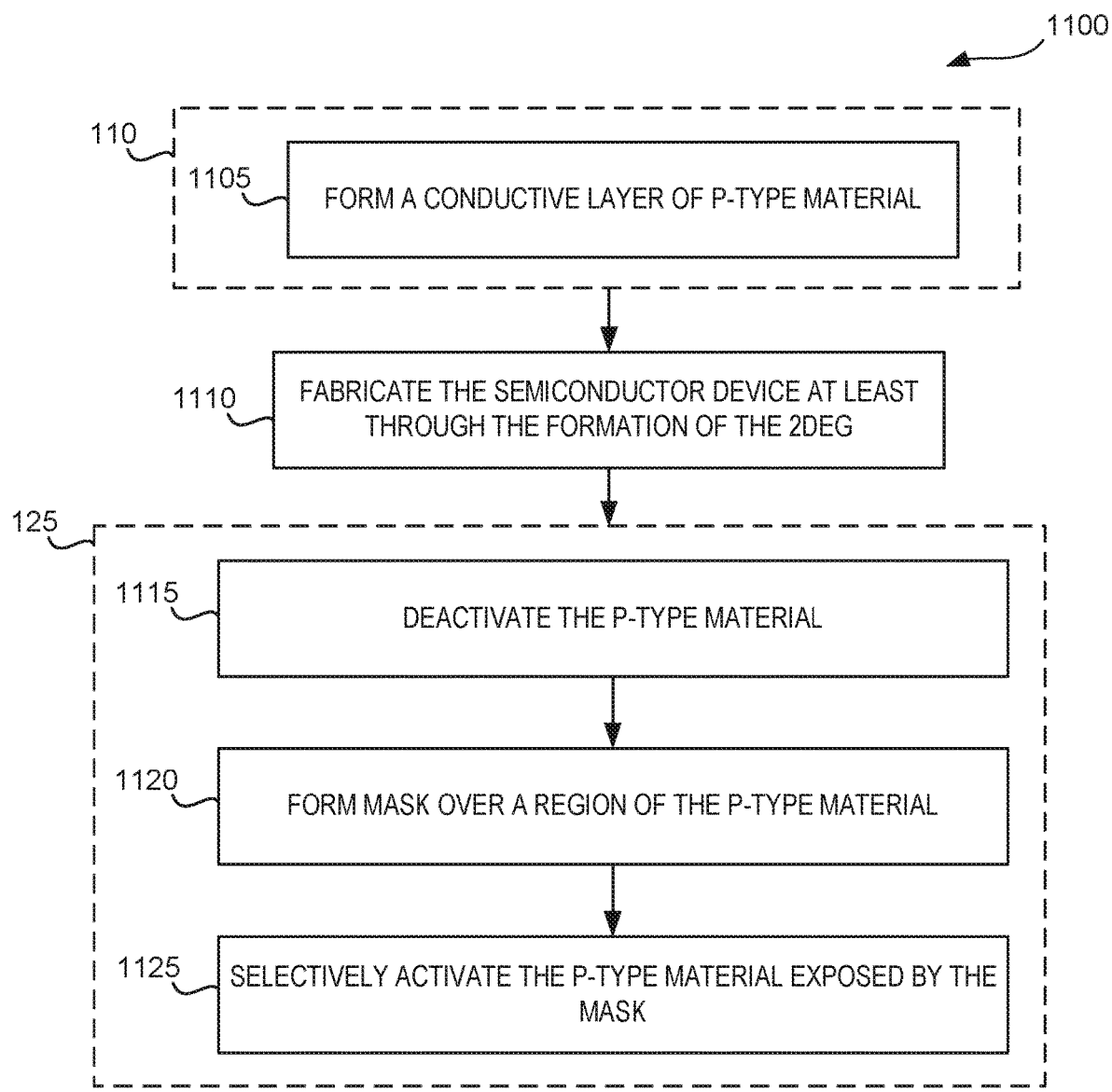
FIG. 11 illustrates a flowchart of an example of a process for forming a back-side field plate from deactivated p-type material during the fabrication of a semiconductor device, according to various embodiments.
Figure 12A:
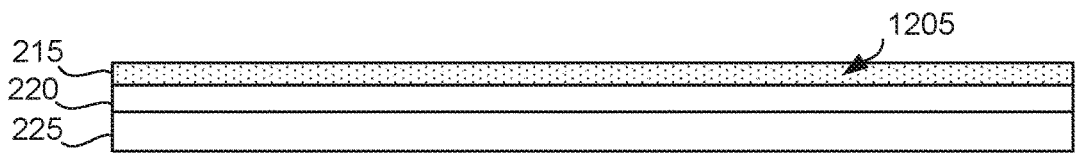
FIGS. 12A, 12B, 12C, 12D, 12E, and 12F illustrates cross sections of layers of a semiconductor device having a back-side field plate formed from deactivated p-type material, according to various embodiments.

FIG. 11 illustrates a flowchart of an example of a process 1100 used to form a back-side field from deactivated p-type material during the fabrication of a semiconductor device, while FIGS. 12A-12F illustrate cross sections of layers of the semiconductor device at each step in the process 1100. The semiconductor device may be a HEMT device, such as the semiconductor device 200. The process 1100 may be an embodiment of the process 100 with steps 110 and 125 expanded to include specific steps for forming a field plate layer and a back-side field plate, respectively. The process 1100 may begin with a partially formed semiconductor device, such as a semiconductor device formed according to step 105 of the process 100 and having a crystalline substrate layer 225 and an epitaxial buffer layer 220, as shown in FIG. 12A.

At 1105, a conductive layer of a p-type material 1205 may be formed on the buffer layer 220. Such conductive layer may be formed by depositing a p-type dopant material, such as magnesium (Mg), using an annealing process that is specifically configured to exclude hydrogen, as shown in 12A.

Figure 12B:
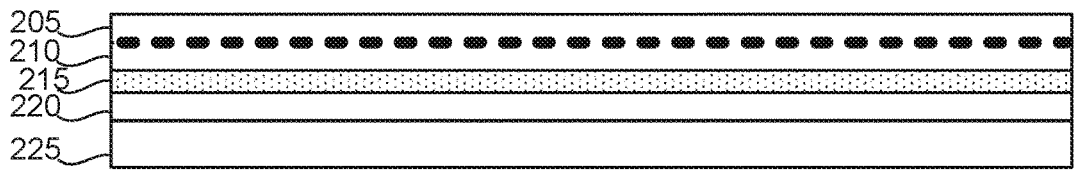

At 1110, the semiconductor device can be fabricated at least through the formation of the 2DEG, as described herein. FIG. 12B shows the partially completed semiconductor device having a 2DEG formed at the interface of an epitaxial layer of a first compound semiconductor and an epitaxial buffer layer of a second component semiconductor, as described herein.

Figure 12C:
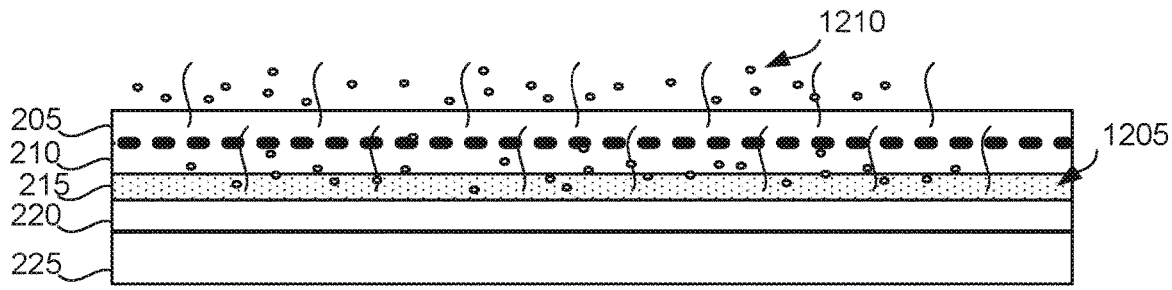

At 1115, the p-type material 1205 may be deactivated, such as by annealing the semiconductor device in the presence of a deactivating material 1210, such as ammonia ($NH_4$) or hydrogen, as shown in FIG. 12C. In some embodiments, this deactivation may be performed after forming the conductive layer of p-type material and before fabricating subsequent layers of the semiconductor device.

Figure 12D:
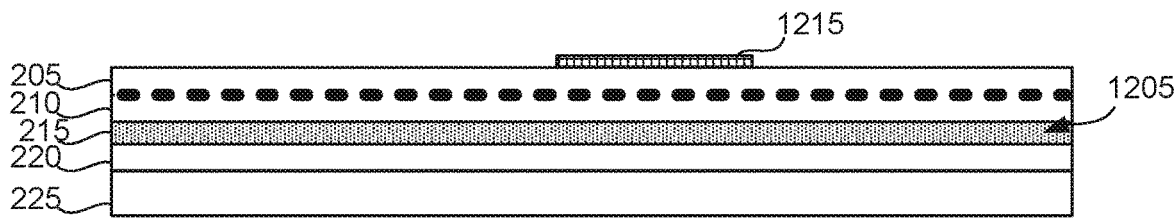

At 1120, a mask 1215 may be formed over a region of the p-type material, such as to define a geometry and a location of a back-side field plate of the semiconductor device, as shown in FIG. 12D. Such mask may include a material selected to absorb wavelengths of light that may otherwise pass through the semiconductor materials used to fabricate the semiconductor device. In an example, when a semiconductor device is constructed from GaN, such mask may include material selected to absorbed light having an energy that is less than the bandgap of the GaN (e.g., 3.3 electron volts). Such masks may generally include refractory metals such as tungsten, tantalum, and rhenium.

Figure 12E:
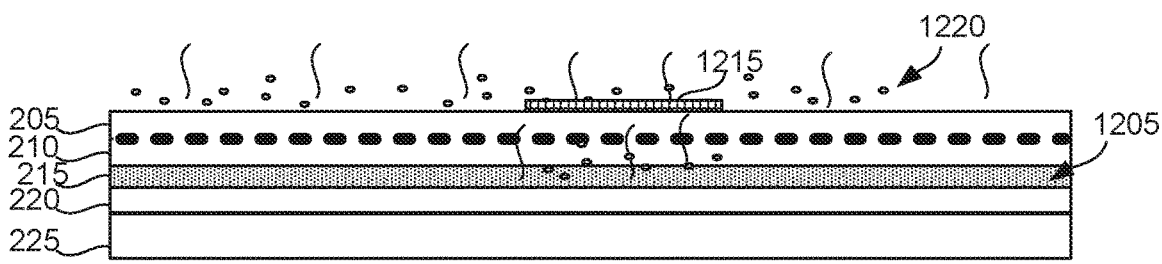

At 1125, the p-type material 1205 located under the mask 1215 may be selectively activated by heating the semiconductor device from the top of the device in the presence of an activating material 1220, such as N2 or magnesium, as shown in FIG. 12E. Such heating may include emitting radiant energy using a light source that is selected to emit light having an energy that is lower than the bandgap energy of the semiconductor materials used to fabricate the semiconductor device.

Figure 12F:
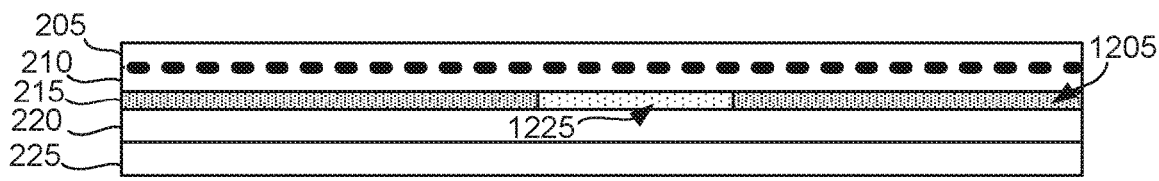

Such heating may cause the radiant energy emitted by the selected light source to pass through regions of the semiconductor device that are exposed by the mask 1215 without heating these exposed regions. Such heating may also cause the radiant energy emitted by the selected light source to be absorbed by the mask 1215, such as to cause local heating in regions of the semiconductor device located under the mask, such as to enable the activating material to diffuse into the heated p-type material. The p-type material that is activated according to this process may form an isolated back-side field plate 1225 as shown in FIG. 12F.

In some embodiments, step 1115 may be omitted, and the mask 1215 may be formed over the conductive layer of p-type material 1205, such as to expose a region of the p-type material that defines a geometry and a location of a back-side field plate of the semiconductor device. In these embodiments, the back-side field plate can be formed by annealing the semiconductor device using the selected light source in the presence of a deactivating material, such as to deactivate regions of the p-type material under the mask 1215 while leaving the region exposed by the bask activated.

In some embodiments, step 1115 may be omitted, and the mask 1215 may include a material selected to inhibit diffusion of a deactivating material. Such mask may be formed over a region of the p-type material 1205, such as to define a geometry and a location of a back-side field plate of the semiconductor device, as shown in FIG. 12D. In these embodiments, the back-side field plate may be formed by annealing the semiconductor device in the presence of a deactivating material using a light source selected to emit radiant energy that is absorbed by the semiconductor materials used to fabricate the semiconductor device, such as to cause the deactivating material to diffuse into, and deactivate, regions of the p-type material that are exposed by the mask 1215.

In some embodiments, step 1115 may be omitted, and the mask 1215 may include a material selected to inhibit the passage of ions having an energy level below a threshold energy level. Such mask may be formed over a region of the p-type material 1205, such as to define a geometry and a location of a back-side field plate of the semiconductor device, as shown in FIG. 12D. In these embodiments, the back-side field plate may be formed by implanting ions of a deactivating material into regions of the p-type material exposed by the mask 1215, such as to cause the deactivating material to deactivate the exposed regions while leaving the masked region of the p-type material activated.

Figure 13:
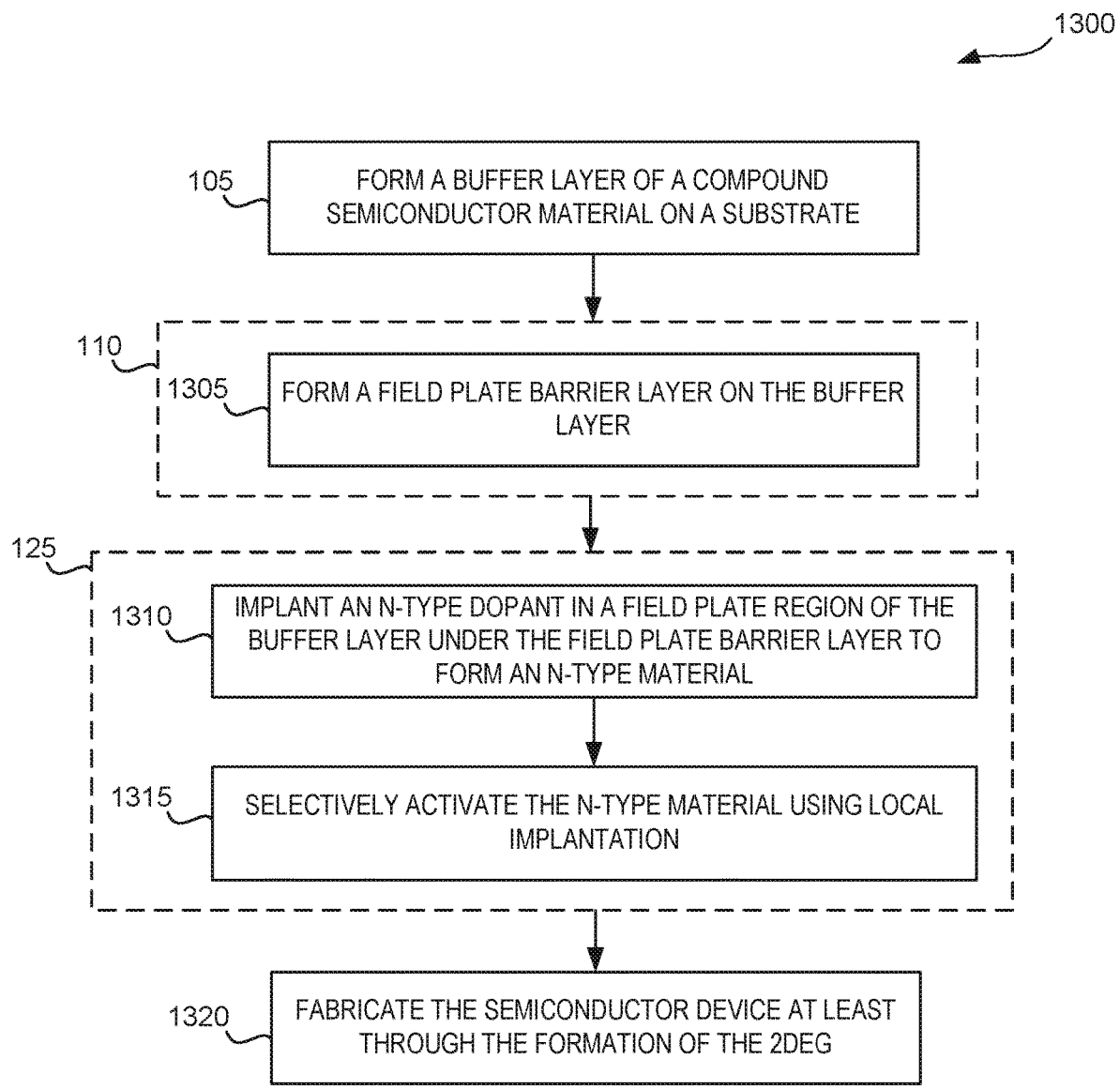
FIG. 13 illustrates a flowchart of an example of a local implantation process for forming a back-side field plate during the formation of a semiconductor device, according to various embodiments.

FIG. 13 illustrates a flowchart of an example of a local implantation process 1300 used to form a back-side field plate during the fabrication of a semiconductor device, according to various embodiments. The process 1300 may be an embodiment of the process 100 with steps 110 and 125 expanded to include specific steps for forming a field plate layer and a back-side field plate, respectively. Although this process is discussed with reference the use of n-type materials, a substantially similar process can be implemented using p-type materials. The process 1300 may begin with a partially formed semiconductor device, such as a semiconductor device formed according to step 105 of the process 100 and having a crystalline substrate layer 225 and an epitaxial buffer layer 220, as shown in FIG. 2.

At 1305, a field plate barrier layer may be formed on the buffer layer, as described herein. At 1310, an n-type dopant may be selectively implanted into a field plate region of the buffer layer, such as to form a region of deactivated n-type material.

At 1315, the deactivated n-type material may be selectively activated, such as by patterning a mask exposing the deactivated n-type material on the semiconductor device and implanting an activating material into the deactivated n-type material using an ion implantation process. At 1320, fabrication of the semiconductor device may then be continued at least through the formation of the 2DEG.

Figure 14A:
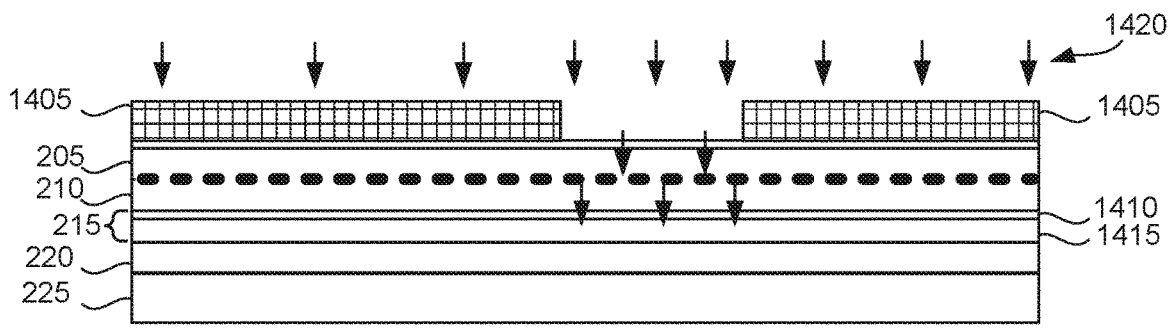
FIGS. 14A, 14B, 14C, 14D, 14E, and 14F illustrates cross sections of layers of a semiconductor device having a back-side field plate formed using a local implantation process, according to various embodiments.
Figure 14B:
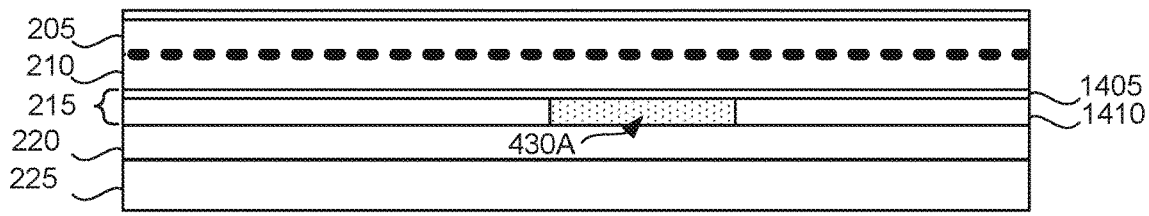

In some embodiments, the semiconductor device may be fabricated through the formation of the 2DEG prior to step 1310, as shown in FIG. 14A. In these embodiments, prior to step 1310, the semiconductor device may include a substrate 225, a buffer layer 220, a field plate layer 215, a first channel layer 210 and a second channel layer 205. The field plate layer 215 may include a region 1415 of the buffer layer 220 and a field plate barrier layer 1410. The semiconductor device may further include a field plate mask 1405. As shown in FIG. 4A the n-type dopant 1420 may be implanted through the field plate layer 215, the first channel layer 210, and the second channel layer 205. Such implanting may form a field plate region 430A which may be activated in accordance with step 1315, as shown in FIG. 14B. Such implanting, however, may cause damage to one or more layers of the semiconductor device. Such damage may be repaired by annealing the semiconductor device. The annealing temperature, however should be selected to avoid deactivating the field plate region 430.

Figure 14C:
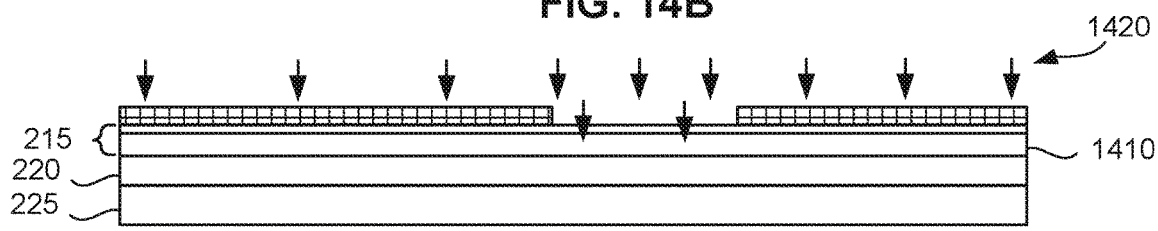
Figure 14D:
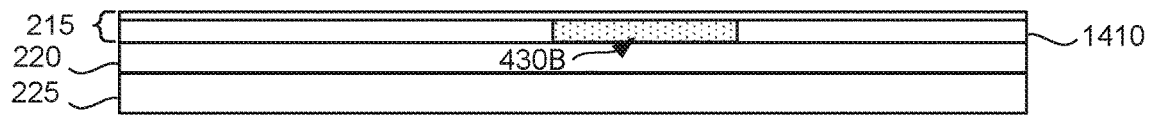

In some embodiments, the semiconductor device may be fabricated through the formation of the field plate barrier layer 1410, prior to step 1310, as shown in FIG. 14C. In these embodiments, the n-type dopant 1420 may be implanted and activated prior to the formation of subsequent semiconductor device layers, such as form a conductive field plate region 430B, as shown in FIGS. 14C and 14D. After activating the field plate region, fabrication of the semiconductor device may continue in accordance with the process 1300, such as by performing a regrowth process to continue fabrication of the device at least through the formation of the 2DEG. This regrowth technique may obviate the need for a carefully controlled annealing process to repair damage that might otherwise be caused by the implantation process.

Figure 14E:
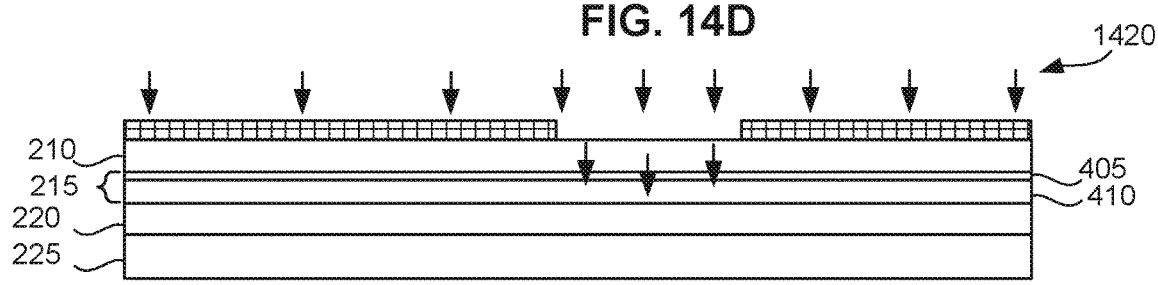
Figure 14F:
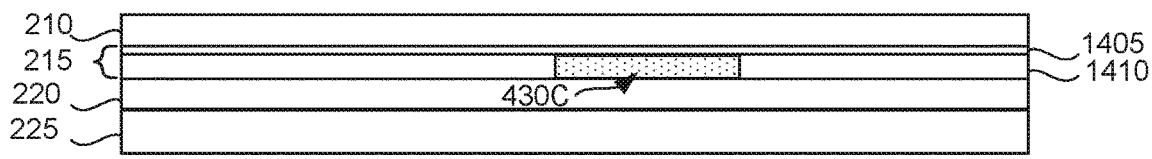

In some embodiments, the semiconductor device may be fabricated through the formation of the first compound semiconductor layer 210, prior to step 1310, as shown in FIG. 14E. In these embodiments, the n-type dopant 1420 may be implanted and activated prior to the formation of subsequent semiconductor device layers, such as form a conductive field plate region 430C, as shown in FIGS. 14E and 14F. After activating the field plate region, fabrication of the semiconductor device may continue in accordance with the process 1300, such as by performing a regrowth process to continue fabrication of the device at least through the formation of the 2DEG. This regrowth technique may obviate the need for a carefully controlled annealing process to repair damage that might otherwise be caused by the implantation process.

Figure 15:
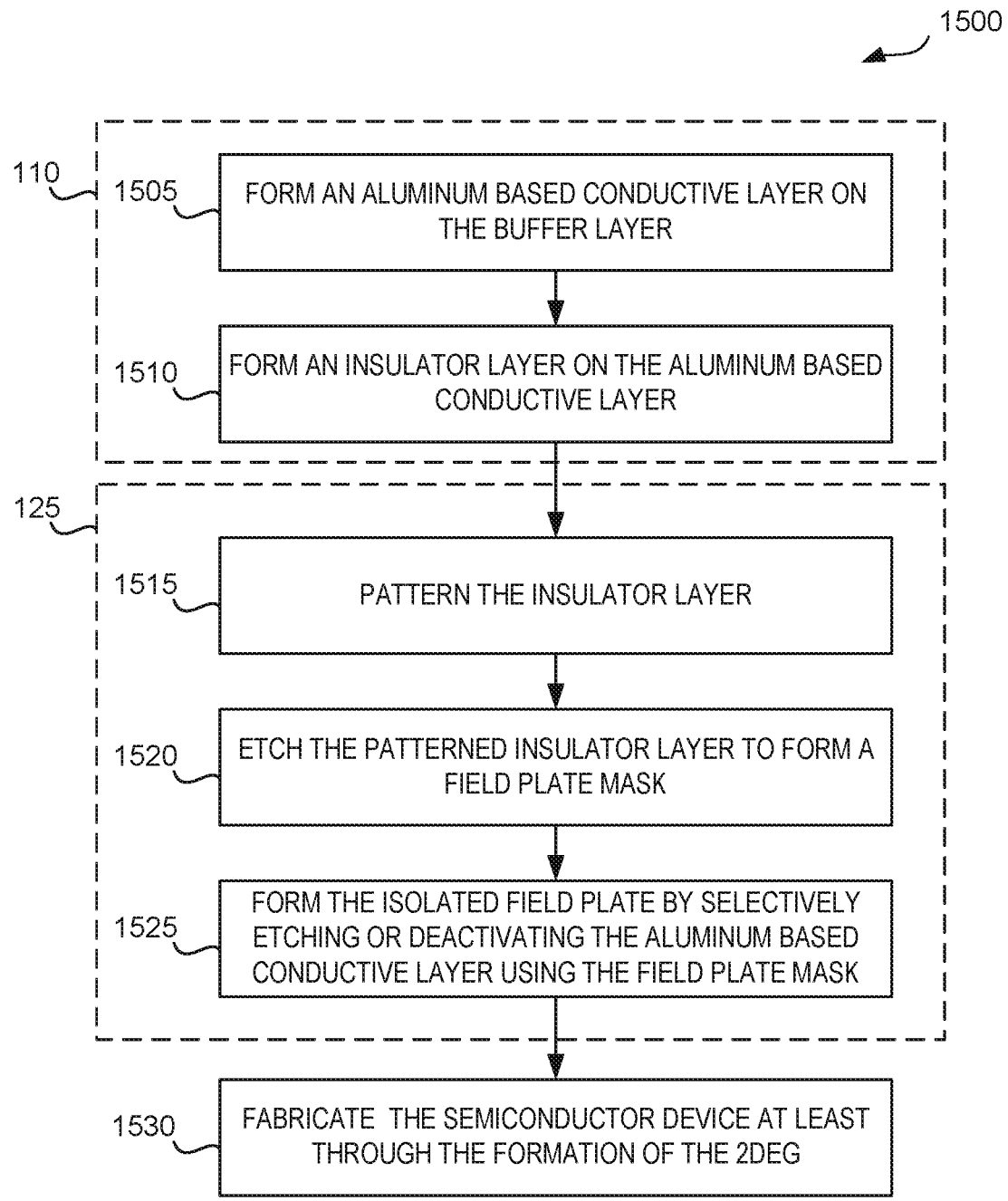
FIG. 15 illustrates a flowchart of an example of an aluminium based process for forming a back-side field plate using a two-dimensional electron gas during the fabrication of a semiconductor device, according to various embodiments.
Figure 16A:
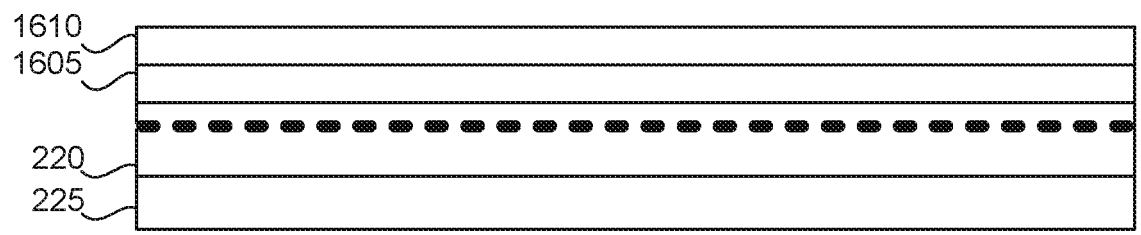
FIGS. 16A, 16B, 16C, and 16D illustrate cross sections of layers of a semiconductor device having a back-side field plate formed using an aluminium based process and a two-dimensional electron gas, according to various embodiments.
Figure 16B:
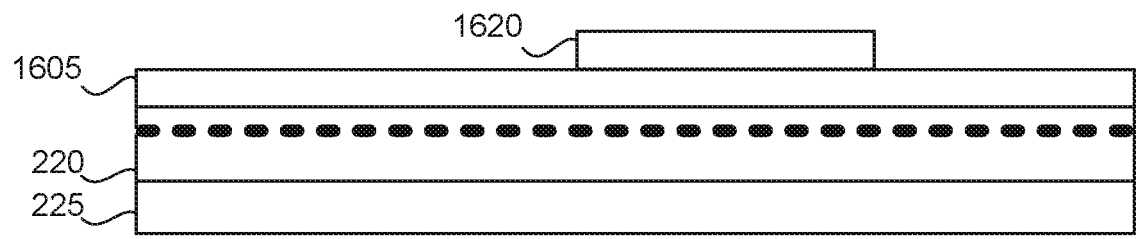
Figure 16C:
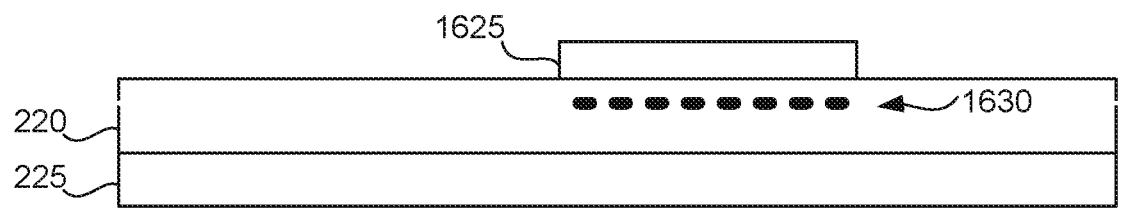

FIG. 15 illustrates a flowchart of an example of an aluminium based process 1500 for forming a back-side field plate using a two-dimensional electron gas during the fabrication of a semiconductor device, while FIGS. 16A-6D illustrate cross sections of layers of the semiconductor device at steps in the process 1500. The semiconductor device may be a HEMT device, such as the semiconductor device 200. The process 1500 may be an embodiment of the process 100 with steps 110 and 125 expanded to include specific steps for forming a field plate layer and a back-side field plate. The process 1500 may begin with a partially formed semiconductor device, such as a semiconductor device may formed according to step 105 of the process 100 and having a crystalline substrate layer 225 and an epitaxial buffer layer 220 (e.g., a GaN buffer layer), as shown in FIG. 16A. At 1505, a conductive layer 1605 of AlN or AlGaN material may be formed on the buffer layer 220. At 1510, an insulator layer 1610, such as a layer of silicon nitride (SiN), may be formed on the conductive layer 1605, as shown in FIG. 6A. At 515, the insulator layer 1610 can be patterned, such as to define the features (e.g., geometry or position) of the back-side filed plate. At 1520, the patterned insulator layer can be etched, such as to form a field plate mask 1620, as shown in FIG. 6B. At 1525, the field plate mask can be used to form a back-side field plate 1630, such as by selectively etching the conductive layer 1605 to remove regions that are not protected by the mask or by using an ion implantation process to deactivate the such unprotected regions. The isolated back-side field plate is formed by a 2DEG at the interface of the buffer layer 220 and the remaining AN or AlGaN material 1625, as shown in FIG. 16C.

Figure 16D:
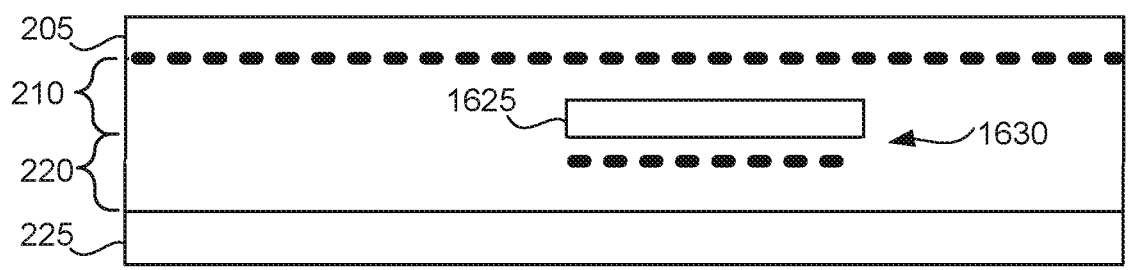

At 1530, the semiconductor device can be fabricated at least through the formation of a second 2DEG, such as to operate as the conductive channel of the semiconductor device. Such fabrication may include epitaxially growing the second layer of the first semiconductor material 210 and forming a second 2DEG by epitaxially growing a barrier layer of a second compound semiconductor material 205 as shown in FIG. 16D.

In certain embodiments, the process 1500 may be completed by forming one or more device components (e.g., a source electrode, a gate electrode, and drain electrode) and electrically coupling the one or more device components to the 2DEG or the heterojunction forming the 2DEG.

Although the above discussion discloses various example embodiments, it should be apparent that those skilled in the art can make various modifications that will achieve some of the advantages of the invention without departing from the true scope of the invention.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A semiconductor device having a back-side field plate, the semiconductor device comprising:
   a buffer layer comprising a first compound semiconductor material, the buffer layer being epitaxial to a crystalline substrate;
   field plate layer disposed on a surface of the buffer layer;
   a first channel layer disposed over the field plate layer, the first channel layer comprising the first compound semiconductor material;
   a region comprising a two-dimensional electron gas, the two-dimensional electron gas formed at an interface between the first channel layer and a second channel layer, the second channel layer comprising a second compound semiconductor material in physical contact with the first channel layer;
   a first back-side field plate that is formed by a region of the field plate layer and is electrically isolated from other regions of the field plate layer; and
   a gate, a source contact, and a field plate contact, the field plate contact coupled to the back-side filed plate, the source contact is disposed along a first dimension of the gate, and the field plate contact is disposed along a second dimension of the gate.

2. The semiconductor device according to claim 1, wherein the field plate layer comprises a deactivated p-type compound semiconductor material and the first back-side field plate comprises an activated p-type compound semiconductor material.

3. The semiconductor device according to claim 1, wherein the field plate layer comprises an unintentionally doped compound semiconductor material and the first back side filed plate comprises an activated p-type compound semiconductor material that is disposed in trench in the unintentionally doped compound semiconductor material, the trench having an opening in the direction of the two-dimensional electron gas.

4. The semiconductor device according to claim 1, wherein the first compound semiconductor is gallium nitride and the second compound semiconductor is aluminum gallium nitride.

5. The semiconductor device according to claim 1, the field plate layer comprises an aluminum nitride material or an aluminum gallium nitride material, and the first backside field plate is formed by a two-dimensional electron gas formed at an interface between the buffer layer and the aluminum nitride material or aluminum gallium nitride material.

6. A method of manufacturing a semiconductor device having a back-side field plate, the method comprising:
   forming buffer layer on a substrate, the buffer layer comprising a first compound semiconductor material;
   forming a field plate layer on the buffer layer;
   forming a first channel layer on the field plate layer, the first channel laver comprising the first compound semiconductor material;
   forming a two-dimensional electron gas by forming a second channel layer on the first channel layer, the second channel layer comprising a second compound semiconductor material; and
   forming a back-side field plate by patterning the field plate layer; and
   forming a gate, a source contact, and a field plate contact, the field plate contact coupled to the back-side filed plate, the source contact is disposed along a first dimension of the gate, and the field plate contact is disposed along a second dimension of the gate.

7. The method of claim 6, wherein the field plate layer comprises a conductive layer of an n-type material and a field plate barrier layer, and the forming the back-side field plate by patterning the field plate layer comprises:
   forming a mask on the second channel layer, the mask determining a geometry of the back-side field plate; and
   isolating the back-side field plate from the other regions of the field plate layer by selectively damaging an area of the n-type material exposed by the mask using an ion implantation process.

8. The method of claim 7, wherein the mask comprises a gate, source, or a drain of the semiconductor device.

9. The method according to aspect 6, wherein the field plate layer comprises a conductive layer of an n-type material and a field plate barrier layer, and the forming the back-side field plate by patterning the field plate layer comprises:
   forming a mask on the field plate barrier layer, the mask determining a geometry of the back-side field plate; and
   isolating, before forming the second channel layer, the back-side field plate from other regions of the field plate layer by selectively damaging an area of the n-type material exposed by the mask using an ion implantation process.

10. The method of claim 9, further comprising:
    growing the second channel layer at a lower temperature than an annealing or activation temperature of the n-type material.

11. The method of claim 6, wherein the field plate layer comprises a region of the buffer layer, and the forming the back-side field plate by patterning the field plate layer comprises:
    etching, before forming first channel layer, a trench in the buffer layer;
    forming a conductive layer of p-type material in the trench and over a surface of the buffer layer; and
    removing the conductive layer of p-type material from the surface of the buffer layer.

12. The method of claim 11, wherein the removing the conductive layer of p-type material comprises using a chemical mechanical planarization process to etch the p-type material from the surface of the buffer layer.

13. The method of claim 11, wherein the field plate layer comprises a region of the buffer layer, and the forming the back-side field plate by patterning the field plate layer comprises:
    etching, before forming the first channel layer, a trench in the buffer layer;
    forming a conductive layer of n-type material in the trench and over a surface of the buffer layer;
    forming a protective layer of material on the conductive layer of n-type mated al the trench; and
    etching the conductive layer of n-type material from the surface of the buffer layer.

14. The method of claim 6, wherein the field plate layer comprises a conductive layer of a p-type material, and the forming the back-side field plate by patterning the field plate layer comprises:
    deactivating, after forming the second channel layer, the p-type material by using an annealing process to diffuse a deactivating material into the p-type material;
    forming a mask comprising a material selected to absorb light that has at least a threshold energy level, the mask covering an area above the p-type material corresponding to a geometry of the back-side field plate; and
    selectively activating the area above the p-type material by heating the semiconductor device in the presence of an activating material using a heat source disposed above the mask, the heat source selected to radiate light having at least the threshold energy level.

15. The method of claim 14, wherein the p-type material is magnesium doped gallium nitride or carbon doped gallium nitride.

16. The method of claim 14, wherein the deactivating material is ammonia or hydrogen and the activating material is nitrogen.

17. The method of claim 14, wherein the mask is polysilicon or a refractory metal.

18. The method of claim 6, wherein the field plate layer comprises a conductive layer of an p-type material, the forming the back-side field plate by patterning the field plate layer comprises:
    forming, after forming the second channel layer, a mask covering an area of the second channel layer above the p-type material corresponding to a geometry of the back-side field plate; and
    deactivating areas of the p-type material exposed by the mask by using an annealing process to diffuse a deactivating material into the p-type material.

19. The method of claim 18, wherein the mask is a metal and the deactivating material is hydrogen.

20. The method of claim 18, herein the mask comprises a material selected to reflect light.

21. The method of claim 11, where field plate layer comprises a conductive layer of an p-type material, the forming the back-side field plate by patterning the field plate layer comprises:
    forming, after forming the second channel layer, a mask covering an area of the second channel layer above the p-type material corresponding to a geometry of the back-side field plate; and
    deactivating areas of the p-type material exposed by the mask by implanting a deactivating material into the p-type material.

22. The method of claim 1, wherein the field plate layer comprises the buffer layer and a field plate barrier layer, and the forming the back-side field plate by patterning the field plate layer comprises:
    selectively implanting, after forming the second channel layer and before forming a device contact, an n-type dopant material in an area of the buffer layer corresponding to the back-side field plate; and
    selectively activating the area of the buffer layer by annealing the semiconductor device in the presence of an activating material.

23. The method of claim 6, wherein the field plate layer comprises the buffer layer and a field plate barrier layer, and forming the back-side field plate by patterning the field plate layer comprises:
    selectively implanting, before forming first channel layer, an n-type dopant material in a region of the buffer layer corresponding to the back-side field plate; and
    selectively activating, before forming the first channel layer, the region implanted with the n-type dopant material.

24. The method of claim 6, wherein the field plate layer comprises an aluminum nitride material or an aluminum gallium nitride material, and forming the back-side field plate by patterning the field play layer comprises etching or deactivating a region of the field plate layer to form a field plate region, the first backside field plate being formed by a two-dimensional electron gas formed at an interface between the buffer layer and field plate region.

25. A transistor having a backside field plate, the transistor comprising:
    a channel layer comprising a first two-dimensional electron gas; and
    a back-side field plate disposed between the channel layer and a crystalline substrate, the back-side field plate comprising a second two-dimensional electron gas, the second two-dimensional electron gas disposed over a smaller area than the first two-dimensional electron gas; and
    a gate, a source contact, and a field plate contact, the field plate contact coupled to the back-side filed plate, the source contact is disposed along a first dimension of the gate, and the field plate contact is disposed along a second dimension of the gate.

26. The transistor of claim 25, wherein the second two-dimensional electron gas is formed at an interface between a gallium nitride layer and a patterned layer of aluminum nitride material or aluminum gallium nitride material.

27. The transistor of claim 25, further comprising:
    a buffer layer comprising a first compound semiconductor material, the buffer layer being epitaxial to the crystalline substrate; and
    field plate layer disposed on a surface of the buffer layer; wherein:
    the back-side field plate further comprises a field plate region of the field plate layer that is electrically isolated from other regions of the field plate layer;
    the channel layer further comprises:
    a first channel layer disposed over the field plate layer, the first channel layer comprising the first compound semiconductor material; and
    a second channel layer comprising a second compound semiconductor material in physical contact with the first channel layer.

28. The transistor of claim 25, wherein the field plate layer is epitaxial to the buffer layer.

29. The transistor of claim 25, wherein the field plate layer comprises a deactivated compound semiconductor material and the field plate region comprises an activated compound semiconductor material.

30. The transistor of claim 25, wherein the first compound semiconductor is gallium nitride and the second compound semiconductor is aluminum gallium nitride.

* * * * *

UNITED STATES PATENT AND TRADEMARK OFFICE
CERTIFICATE OF CORRECTION

PATENT NO. : 11,355,598 B2
APPLICATION NO. : 16/502285
DATED : June 7, 2022
INVENTOR(S) : Srivastava et al.

It is certified that error appears in the above-identified patent and that said Letters Patent is hereby corrected as shown below:

In the Claims

Column 15, Line 55, in Claim 6, delete "laver" and insert --layer-- therefor

Column 16, Line 43, in Claim 13, delete "claim 11," and insert --claim 6,-- therefor Column 16, Line 52, in Claim 13, delete "mated al" and insert --material-- therefor Column 17, Line 26, in Claim 20, delete "herein" and insert --wherein-- therefor Column 17, Line 28, in Claim 21, delete "claim 11," and insert --claim 6,-- therefor Signed and Sealed this
Seventeenth Day of January, 2023

Katherine Kelly Vidal
*Director of the United States Patent and Trademark Office*